United States Patent
Imamura et al.

(10) Patent No.: US 9,780,011 B2
(45) Date of Patent: Oct. 3, 2017

(54) BRAZING MATERIAL, BRAZING MATERIAL PASTE, CERAMIC CIRCUIT SUBSTRATE, CERAMIC MASTER CIRCUIT SUBSTRATE, AND POWER SEMICONDUCTOR MODULE

(75) Inventors: Hisayuki Imamura, Kitakyushu (JP); Suguru Fujita, Kitakyushu (JP); Junichi Watanabe, Kitakyushu (JP)

(73) Assignee: HITACHI METALS, LTD., Tokyo (JP)

( * ) Notice: Subject to any disclaimer, the term of this patent is extended or adjusted under 35 U.S.C. 154(b) by 254 days.

(21) Appl. No.: 14/127,476

(22) PCT Filed: Jul. 2, 2012

(86) PCT No.: PCT/JP2012/066859
§ 371 (c)(1),
(2), (4) Date: Dec. 18, 2013

(87) PCT Pub. No.: WO2013/002407
PCT Pub. Date: Jan. 3, 2013

(65) Prior Publication Data
US 2014/0126155 A1  May 8, 2014

(30) Foreign Application Priority Data
Jun. 30, 2011  (JP) .................................. 2011-146708

(51) Int. Cl.
*H01L 23/34* (2006.01)
*B23K 35/30* (2006.01)
(Continued)

(52) U.S. Cl.
CPC .............. *H01L 23/34* (2013.01); *B22F 7/062* (2013.01); *B23K 35/025* (2013.01);
(Continued)

(58) Field of Classification Search
CPC .. B23K 35/3006; B23K 35/36; B23K 35/0244; H01L 23/34
(Continued)

(56) References Cited

U.S. PATENT DOCUMENTS 4,749,594 A * 6/1988 Malikowski ....... B23K 35/3006
427/190
4,883,745 A * 11/1989 Mizuhara ........... B23K 35/3006
228/262.31
(Continued)

FOREIGN PATENT DOCUMENTS

JP  4-285076 A  10/1992
JP  11-130555 A  5/1999
(Continued)

*Primary Examiner* — Colleen Dunn
*Assistant Examiner* — Jeremy Jones
(74) *Attorney, Agent, or Firm* — Birch, Stewart, Kolasch & Birch, LLP

(57) ABSTRACT

To provide a brazing material for maintaining bonding strength between ceramic substrate and metal plate at a conventionally attainable level, while addition amount of In is reduced, and a brazing material paste using the same. A mixture powder provided by mixing alloy powder composed of Ag, In, and Cu, Ag powder, and active metal hydride powder, the mixture powder containing active metal hydride powder with a 10-to-25-μm equivalent circle average particle diameter by 0.5 to 5.0 mass %, the equivalent circle average particle diameters for the alloy powder, Ag powder, and active metal hydride powder having a relationship: alloy powder≥active metal hydride powder>Ag powder, and the powder mixture having a particle size distribution of d10 of 3 to 10 μm, d50 of 10 to 35 μm, and d90 of 30 to 50 μm, and in the frequency distribution, a peak of the distribution existing between d50 and d90.

16 Claims, 12 Drawing Sheets

(51) Int. Cl.
  *B22F 7/06* (2006.01)
  *B23K 35/36* (2006.01)
  *B23K 35/02* (2006.01)
  *C22C 1/04* (2006.01)
  *C22C 5/06* (2006.01)
  *C22C 5/08* (2006.01)
  *C04B 37/02* (2006.01)
  *H01L 23/15* (2006.01)
  *H01L 23/373* (2006.01)
  *B22F 9/02* (2006.01)
  *B23K 101/40* (2006.01)
  *H05K 1/03* (2006.01)
  *H05K 3/38* (2006.01)

(52) U.S. Cl.
  CPC ...... *B23K 35/0244* (2013.01); *B23K 35/3006* (2013.01); *B23K 35/36* (2013.01); *C04B 37/026* (2013.01); *C22C 1/0466* (2013.01); *C22C 5/06* (2013.01); *C22C 5/08* (2013.01); *H01L 23/15* (2013.01); *H01L 23/3735* (2013.01); *B22F 9/023* (2013.01); *B23K 2201/40* (2013.01); *C04B 2235/6562* (2013.01); *C04B 2235/6565* (2013.01); *C04B 2235/6567* (2013.01); *C04B 2235/6581* (2013.01); *C04B 2235/96* (2013.01); *C04B 2237/125* (2013.01); *C04B 2237/126* (2013.01); *C04B 2237/127* (2013.01); *C04B 2237/128* (2013.01); *C04B 2237/343* (2013.01); *C04B 2237/366* (2013.01); *C04B 2237/368* (2013.01); *C04B 2237/407* (2013.01); *C04B 2237/597* (2013.01); *C04B 2237/704* (2013.01); *C04B 2237/706* (2013.01); *H01L 2924/0002* (2013.01); *H05K 1/0306* (2013.01); *H05K 3/38* (2013.01); *Y10T 428/12014* (2015.01); *Y10T 428/249969* (2015.04)

(58) Field of Classification Search
  USPC .................................. 75/255; 420/501–502
  See application file for complete search history.

(56) References Cited

U.S. PATENT DOCUMENTS

| | | |
|---|---|---|
| 5,807,626 A | 9/1998 | Naba |
| 2001/0053456 A1* | 12/2001 | Kepniss ............. B23K 35/0222 428/567 |
| 2006/0219756 A1 | 10/2006 | Tada et al. |
| 2009/0139607 A1* | 6/2009 | Kool ................. B23K 35/0244 148/23 |

FOREIGN PATENT DOCUMENTS

| | | | |
|---|---|---|---|
| JP | 2001339155 A | * | 12/2001 |
| JP | 2002-292490 A | | 10/2002 |
| JP | 2003-335585 A | | 11/2003 |
| JP | 2004-314161 A | | 11/2004 |
| JP | 2004314161 A | * | 11/2004 |
| JP | 2005-112677 A | | 4/2005 |
| JP | 2009-170930 A | | 7/2009 |
| WO | WO 2005/012206 A1 | | 2/2005 |

* cited by examiner

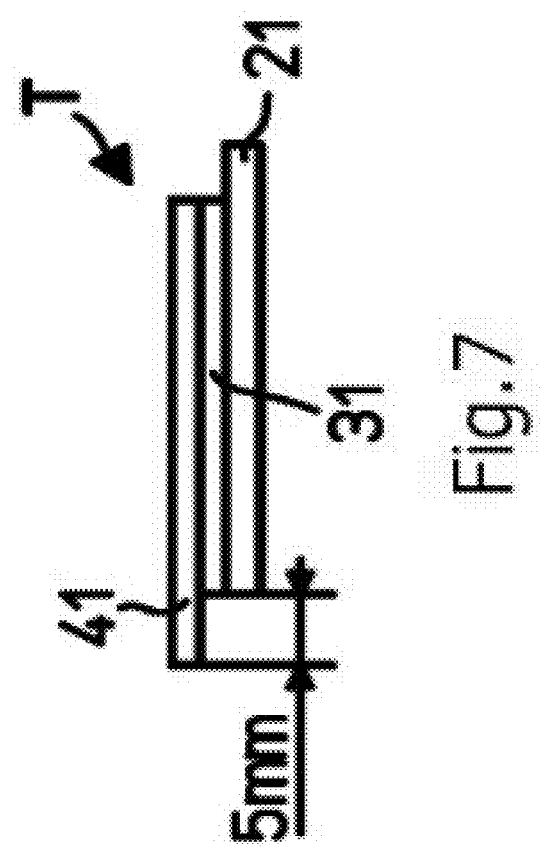

BRAZING MATERIAL, BRAZING MATERIAL PASTE, CERAMIC CIRCUIT SUBSTRATE, CERAMIC MASTER CIRCUIT SUBSTRATE, AND POWER SEMICONDUCTOR MODULE

TECHNICAL FIELD

The present invention relates particularly to a brazing material for bonding between a ceramic substrate and a metal plate for a ceramic circuit substrate to be used with a power semiconductor module, and the like.

BACKGROUND ART

As an inverter for electric vehicles, a power semiconductor module (IGBT module) which is capable of making a high-voltage, large-current operation is being used. And, in recent years, for power semiconductor modules, realization of high output power and high integration have rapidly being progressed, and ceramic circuit substrates have increasingly been demanded to have a sufficient strength against a thermal stress in bonding and a sufficient bonding strength between a ceramic substrate and a metal plate against thermal cycling in severe atmosphere. As the circuit substrate for use in power semiconductor modules, a ceramic circuit substrate with which a metal plate, such as a copper plate, an aluminum plate, or the like, is bonded to a ceramic substrate composed of aluminum nitride or silicon nitride is widely used. This ceramic circuit substrate is formed by, for example, bonding a copperplate for circuit to load a semiconductor chip, and the like, to one face of a ceramic substrate, while bonding a copper plate for heat dissipation on another face. The above-mentioned copperplate for circuit has a circuit pattern composed of a plurality of copper plates which, by generally providing an etching treatment, or the like, become circuit parts. Herein below, in order to clarify the problems of the prior art, the present invention will be explained by using a copper plate as the metal plate, however, the present invention is not limited only to a case where a copper plate is used as the metal plate.

As a means for bonding between a ceramic substrate and a copper plate, the following means is being used. In other words, the direct copper bonding method (DCB method: Direct Copper Bonding method) is available which utilizes an eutectic liquid phase, such as Cu—$Cu_2O$, or the like, to directly bond a copper plate to a ceramic substrate. In addition, the high melting point metal metalizing method is available which bakes a high melting point metal, such as Mo or W, on a ceramic substrate to form a metallic layer. Further, the active metal method is available which places a metal plate on a ceramic substrate coated with a brazing material containing an active metal, such as a 4A family element or a 5A family element, heating it at a moderate temperature while applying a pressing force thereto, thereby bonding the copper plate to the ceramic substrate through a brazing material layer formed of the brazing material. Any of the ceramic circuit substrates which are obtained by the DBC method and the active metal method offer such advantages as that the structure is simple, having a low thermal resistance, and can cope with semiconductor chips of large-current type and high integration type.

In addition, as a means for forming a circuit pattern of a copperplate for circuit, the following means is being used. In other words, the direct loading method is available which bonds a copper plate for circuit on which a circuit pattern is previously formed by press method or etching method to a ceramic substrate through a brazing material layer. In addition, the multistage etching method is available which forms a brazing material layer on substantially the entire face of a ceramic substrate, and bonds a copperplate so as to cover it, thereafter, making an etching treatment of both the copper plate and the brazing material layer to form a circuit pattern. Further, a method which uses brazing material pattern printing and etching in combination (hereinafter, referred to as the pattern printing etching method) is available which forms a brazing material layer along the geometry of a circuit pattern, and places a copper plate so as to cover this brazing material layer, then making an etching treatment of the copper plate in the same manner as with said multistage etching method for forming the circuit pattern.

Conventionally, of the above-mentioned means for bonding between ceramic substrate and metal plate, because a high strength, a high adhesion, and the like are obtained, the active metal method, using a brazing material paste in which an active metal, such as Ti, is added to an eutectic brazing material having an eutectic composition of Ag and Cu (72 mass % Ag-28 mass % Cu), is generally used. However, in the case where a brazing material having an Ag—Cu based eutectic composition as mentioned above is used for bonding a copper plate to a ceramic substrate, the brazing temperature is increased, because the melting point of the brazing material is high. If a ceramic substrate is bonded to a copper plate at a high brazing temperature, a residual stress attributable to the difference in coefficient of thermal expansion between both caused a warpage in the ceramic circuit substrate in some cases.

Further, with a ceramic circuit substrate on which a power semiconductor module is mounted, the thermal cycle applied at the time of starting or stopping the power semiconductor module causes a thermal stress to be repetitively imposed, being superimposed on the above-mentioned residual stress. And, if the resultant force of the residual stress and the thermal stress becomes too high to be withstood, the copper plate was peeled off from the ceramic substrate in some case. From such problems presented at the time of bonding between a ceramic substrate and a copper plate, and at the time of using a ceramic circuit substrate, a brazing material which is low in melting point has been demanded, and one example thereof has been proposed in the following Patent Document 1.

In Patent Document 1, in order to provide a brazing material which has a high bonding strength, being stable, and low in melting point, there is a disclosure of a paste brazing material which compounds a mixture of a powder mixture of an Ag—Cu—In alloy powder and a Ti powder, an organic solvent, and a resin, the brazing material preferably having a specific composition of 30 to 60% of Ag, 20 to 45% of Cu, 20 to 40% of In, and 0.5 to 5% of Ti.

As a result of examination of the brazing material disclosed in Patent Document 1 in which a large amount of In is added in order to lower the melting point of the brazing material, the present inventors have found that there is a problem that the bonding strength between the ceramic substrate and the copper plate is decreased. The cause of this is as follows. In other words, a brazing material in which a large amount of In is added has a low melting point, allowing the brazing temperature to be lowered. However, on the surface of a brazing material layer formed of such a brazing material, scale-like irregularities are formed. And, it has been found that, resulting from the scale-like irregularities, voids (vacancies) are generated at the bonding interface between the brazing material layer and the ceramic substrate, and the voids cause the bonding strength to be lowered. Herein, the convex part of the scale-like irregularities formed on the surface of the brazing material layer provides an Ag—In phase and a Cu—In phase which are formed like an island, while the concave part providing a Ti—Cu phase. With a brazing material in which a large amount of In is added, at the bonding interface between the brazing material layer and the ceramic substrate, a number of Ag—In phases and Cu—In phases, which constitute convex parts, and a number of Ti—Cu phases, constituting concave parts, are distributed, and it has been found that such concave parts give voids to thereby lower the bonding strength between the copper plate and the ceramic substrate.

Then, the present inventors have proposed a brazing material in which Ag powder particles having an average particle diameter of 1 to 15 μm are added by 5 to 30 mass % to the alloy powder disclosed in Patent Document 2 that has an average particle diameter of 15 to 40 μm, being composed of 55 to 85 mass % of Ag, 5 to 25 mass % of In, 0.2 to 2.0 mass % of Ti, and the balance Cu with inevitable impurities. The proposal is based on the finding that, by post-adding Ag powder particles having an appropriate particle diameter and particle size distribution by an appropriate amount to the alloy powder using an Ag—Cu—In—Ti-based brazing material as a base material, the scale-like irregularities which are formed on the surface of a brazing material layer in bonding of a copper plate are moderated, whereby the bonding strength can be improved.

CITATION LIST

Patent Literature

Patent Document 1: Japanese Patent Unexamined Application Publication No. Hei 4-285076
Patent Document 2: Japanese Patent Unexamined Application Publication No. 2004-314161

DISCLOSURE OF THE INVENTION

Problems to be Solved by the Invention

In recent years, the distribution amount of rare metals has been reduced worldwide, and In, which is added to a brazing material as mentioned above, is no exception, not only the price thereof being raised, but also depending upon the supply and demand state, a situation in which procurement is impossible on the market having been more often caused. In such a situation, there is a demand for a brazing material which, in order to stably produce a low-cost brazing material, allows the addition amount of In to be cut more than is possible by the conventional technology, while the bonding strength between the ceramic substrate and the metal plate being maintained at a level equal to that attainable by the conventional technology.

In addition, if an active metal hydride is contained in the alloy powder, as with the brazing material which is proposed by the inventors of the present application in Patent Document 2, the active metal generated by decomposition of the active metal hydride is deteriorated, resulting from the oxygen, and the like, contained in the alloy powder. The deteriorated active metal can no longer contribute to formation of a compound layer having a capability of securing the bondability between the ceramic substrate and the metal plate, and especially in the case where the content of the active metal hydride is low, a desirable bonding strength could not be secured in some cases. In addition, outside of the content of the active metal hydride in the alloy powder, such factors as the difference in particle diameter between the alloy powder and the Ag powder, and the addition amount of the Ag powder have resulted in an insufficient bonding strength, depending upon the combination of the components of the brazing material.

In view of the above-mentioned problems, the present invention has been made, and it is an object of the present invention to provide a brazing material with which the bonding strength between the ceramic substrate and the metal plate is maintained at a level equal to that attainable by the conventional technology, while the addition amount of In is reduced, and a brazing material paste using the pertinent brazing material. Further, it is another object of the present invention to provide a ceramic circuit substrate and a ceramic master circuit substrate having a ceramic substrate and a metal plate which are bonded by the above-mentioned brazing material to have a desirable bonding strength. Still further, it is another object of the present invention to provide a power semiconductor module which incorporates the above-mentioned ceramic circuit substrate having a desirable bonding strength.

Means for Solving the Problems

As a result of intensive studies to solve the above-mentioned problems, the present inventors have found that, by (1) constituting a brazing material using a powder mixture which mixes three different powders of an Ag—Cu based alloy powder with which the addition amount of In has been reduced more than is possible by the conventional technology, an Ag powder, and an active metal hydride powder; (2) controlling the powder mixture so as to provide an appropriate particle size distribution with the relationship among the particle diameters of the above-mentioned three different powders of alloy powder≥Ag powder>active metal hydride powder being met, and (3) adjusting the particle diameter and addition amount of the active metal hydride powder in the powder mixture to a prescribed range, a brazing material with which the bonding strength between the ceramic substrate and the metal plate can be maintained at a level equal to that attainable by the conventional technology can basically be constituted, even if the addition amount of In in the alloy powder is reduced more than is possible by the conventional technology.

One aspect of the present invention based on such findings provides a brazing material for bonding between a ceramic substrate and a metal plate, the brazing material being a powder mixture provided by mixing an alloy powder composed of at least 55 to 80 mass % of Ag, 1 to 5 mass % of In, and the balance Cu with inevitable impurities, an Ag powder, and an active metal hydride powder,
a composition ratio of Ag to the total amount of Ag and Cu contained in said powder mixture, Ag/(Ag+Cu), being 0.57 to 0.85,
the brazing material containing an active metal hydride powder with an equivalent circle average diameter of particles of 10 to 25 μm by 0.5 to 5.0 mass %,
the equivalent circle average diameters of particles for said alloy powder, Ag powder, and active metal hydride powder having a relationship of alloy powder≥active metal hydride powder>Ag powder, and
in the cumulative distribution in volume base given upon a measurement of the particle size distribution in conformity with JIS Z 8825-1, said powder mixture having a particle size distribution of a cumulative 10% particle diameter (d10) of 3 to 10 μm, a cumulative 50% particle diameter (d50) of 10 to 35 μm, and a cumulative 90% particle diameter (d90)

of 30 to 50 μm, and in the frequency distribution, a peak existing between the cumulative 50% particle diameter (d50) and the cumulative 90% particle diameter (d90).

According to the above-mentioned brazing material, with the amount of In in the alloy powder contained in the brazing material being cut more than is possible by the conventional technology as mentioned in (1) above, the amount of In contained in the entire brazing material is also reduced, thereby the brazing temperature is raised. However, according to the above-mentioned brazing material, by optimizing the particle diameter (equivalent circle average diameter) and addition amount of the active metal hydride powder in the powder mixture (brazing material), and the particle diameter distribution of the powder mixture, as mentioned in (2) and (3) above, the active metal compound layer (hereinafter, may be referred to as the compound layer) generated through the reaction between the element contained in the substrate and the active metal in the course of temperature rise is uniformly formed at the bonding interface between the brazing material layer and the ceramic substrate. This compound layer is a layer for assuring the bondability between the brazing material layer and the ceramic substrate, in other words, the bondability between the metal plate and the ceramic substrate.

And, by reducing the addition amount of In in the alloy powder, scale-like irregularities which can cause voids (vacancies) to be produced at the bonding interface between the ceramic substrate and the brazing material layer is more suppressed from being generated. In other words, according to the brazing material in accordance with the present invention, the action of the combination of the schemes in (1) to (3) mentioned above results in the bonding strength between the ceramic substrate and the metal plate being maintained at a level equal to that attainable by the conventional technology, even if the amount of In in the alloy powder is reduced, and in the case where a repetitive thermal stress due to a thermal cycle is imposed on the ceramic circuit substrate, being superimposed on the residual stress, the metal plate is prevented from being peeled off from the ceramic substrate.

Herein below, the grounds for restriction of the respective components of the above-mentioned brazing material will be explained. The composition of the alloy powder is specified to be 55 to 80 mass % of Ag, 1 to 5 mass % of In, and the balance Cu with inevitable impurities. If the Ag is under 55 mass % or exceeds 80 mass %, the melting point of the alloy powder is increased. If the In is under 1 mass %, the melting point of the alloy powder is increased, and if it exceeds 5 mass %, the cost of the brazing material is increased, and scale-like irregularities, which can cause voids on the surface of the brazing material layer, are easily formed.

The brazing material in accordance with the present invention, being a powder mixture provided by mixing three different powders of the above-mentioned alloy powder, Ag powder, and active metal hydride powder, has a composition ratio of Ag to the total amount of Ag and Cu contained in said powder mixture, Ag/(Ag+Cu), of 0.57 to 0.85. If the composition ratio is under 0.57 or exceeds 0.85, the melting point of the brazing material in the state in which the alloy powder, Ag powder, and active metal hydride powder are heated to be melted, and these melts are mixed is increased. Further, in this composition, if the solid-liquid coexistent composition range on the Ag-rich side with respect to the eutectic composition (72% Ag-28% Cu) range in the Ag—Cu phase diagram is selected, and the brazing temperature is properly set, the amount of melt at the time of bonding treatment can be adjusted, and the excessive wet-spreading phenomenon exhibited by the melted brazing material can be suppressed.

Further, it is necessary that the brazing material contain an active metal hydride powder with an equivalent circle average diameter of particles of 10 to 25 μm by 0.5 to 5.0 mass %. If the content of the active metal hydride powder or the equivalent circle average diameter of particles is outside of the pertinent range, a desirable bonding strength cannot be secured.

Further, in order to secure a desirable bonding strength, it is necessary that the equivalent circle average diameters of particles for said alloy powder, Ag powder, and active metal hydride powder meet a relationship of alloy powder≥active metal hydride powder>Ag powder, and in the cumulative distribution in volume base given upon a measurement of the particle size distribution in conformity with JIS Z 8825-1, said powder mixture have a particle size distribution of a cumulative 10% particle diameter (d10) of 3 to 10 μm, a cumulative 50% particle diameter (d50) of 10 to 35 μm, and a cumulative 90% particle diameter (d90) of 30 to 50 μm, and in the frequency distribution, a peak exist between the cumulative 50% particle diameter (d50) and the cumulative 90% particle diameter (d90).

In other words, if the brazing material is constituted with the use of the alloy powder and the active metal hydride powder alone, the number of voids between particles in the alloy powder and the active metal hydride powder is increased, thereby the fillability of the particles of the respective powders constituting the brazing material is lowered. On the other hand, by adding an Ag powder having small diameters, the equivalent circle average diameter thereof having the relationship of alloy powder≥active metal hydride powder>Ag powder, to the brazing material, thereby the particle size distribution of the powder mixture being brought into the above-mentioned range, the fillability of the brazing material can be enhanced as shown in FIG. 1.

Herein, FIG. 1 is an electronic microscopic photograph of 100 times showing the morphology of a brazing material after adding 15 pts. mass of an Ag powder with a d10 of 2.7 μm, a d50 of 5.6 μm, and a d90 of 9.9 μm, and 2 pts. mass of a titanium hydride powder, which is an active metal hydride powder, with a d10 of 10.1 μm, a d50 of 18.7 μm, and a d90 of 33.0 μm to an alloy powder composed of 65.5 mass % of Ag with a d10 of 8.7 μm, a d50 of 24.2 μm, and a d90 of 45.5 μm, 2 mass % of In, 0.05% of oxygen content, and the balance Cu. As shown in FIG. 1, a state in which the voids between particles of the alloy powder and the active metal hydride powder are filled with the Ag powder is provided, thereby the fillability of the brazing material being improved, and as a result of this, the bonding strength between the ceramic substrate and the metal plate can be improved. In order to further enhance the fillability of the brazing material, it is preferable that the equivalent circle average diameters of particles of the alloy powder, Ag powder and active metal hydride powder meet the relationship of alloy powder>active metal hydride powder>Ag powder.

In FIG. 1, there is provided a state in which, by adding an Ag powder and a titanium hydride powder, the voids between particles of the alloy powder are filled, thereby the fillability of the respective particles constituting the brazing material has been enhanced. This high fillability effectively acts for moderating the later described scale-like irregularities of the brazing material layer surface, improving the linearity of the outer edge of the printing pattern obtained when a pasted braze is printed, and the like.

Further, in order to further enhance the fillability of the brazing material, it is preferable that said peak exist between the cumulative 60% particle diameter (d60) and the cumulative 80% particle diameter (d80).

The brazing material constituted as above has a bulk density of 3.6 to 5.5 g/cm$^3$. If the bulk density of the brazing material is under 3.6 g/cm$^3$, the voids between particles of the alloy powder are not sufficiently filled with the Ag powder, thereby the bonding strength between the ceramic substrate and the metal plate is relatively low. In addition, with a printing pattern of the brazing material paste formed on the surface of the ceramic substrate by screen printing, or the like, the distribution of the respective particles of the brazing material becomes coarser, thereby the amount of the brazing material that is required for bonding between the metal plate and the ceramic substrate may be insufficient.

On the other hand, if the bulk density of the brazing material exceeds 5.5 g/cm$^3$, the amount of the brazing material contained per unit volume of the brazing material paste provided by pasting this brazing material becomes excessive, thereby the wet-spreading of the heated and melted brazing material is increased in bonding.

Further, it is desirable that the value of (d50–d10)/(d90–d10) be 0.25 to 0.65. If the value of (d50–d10)/(d90–d10) is under 0.25, there exists a less amount of particles having smaller particle diameters, thereby the fillability of the brazing material is relatively poor, the bonding strength being lowered. On the other hand, if the value of 0.65 is exceeded, there exists a more amount of particles having a smaller particle diameter, thereby the heated and melted brazing material is caused to more easily wet-spread to the surface of the metal plate in bonding.

In addition, in order to further enhance the fillability of the brazing material, it is desirable that the value of (d50-d10)/40% be 0.15 to 0.65 μm/%.

Further, it is preferable that, specifically, the above-mentioned brazing material include an alloy powder with a cumulative 50% particle diameter (d50) of 15 to 40 μm composed of 55 to 80 mass % of Ag, 1 to 5 mass % of In, 0.1 mass % or under of oxygen content, and the balance Cu with inevitable impurities; 5 to 30 pts. mass of Ag powder particles with a cumulative 50% particle diameter (d50) of 1 to 15 μm for 100 pts. mass of said alloy powder; and 0.5 to 5 pts. mass of active metal hydride powder having a particle size distribution of a cumulative 10% particle diameter (d10) of 5 to 15 μm, a cumulative 50% particle diameter (d50) of 10 to 25 μm, and a cumulative 90% particle diameter (d90) of 25 to 50 μm. Hereinbelow, the respective components of the brazing material of such a preferable aspect will be explained.

[Alloy Powder]

As mentioned above, the alloy powder contained in the brazing material of a preferable aspect is basically constituted by 55 to 85 mass % of Ag, 1 to 5 mass % of In, and the balance Cu with inevitable impurities, and preferably the oxygen content is 0.1 mass % or under. If the oxygen content exceeds 0.1 mass %, an active metal generated from the active metal hydride powder, which is decomposed first of all in the course of temperature rise, easily reacts with oxygen to become an oxide, thereby the active metal will not play a role as such. In other words, generation of a compound layer required for bonding between the ceramic substrate and the brazing material layer is suppressed, thereby voids are formed at the bonding interface, resulting in the bonding strength being lowered. On the same ground, it is preferable that the oxygen content of the Ag powder and that of the active metal hydride powder be 0.1 mass % or under.

It is desirable that the ratio of Ag to the total amount of Ag and Cu contained in the alloy powder, Ag/(Ag+Cu), be 0.6 to 0.7. If the value of Ag/(Ag+Cu) is under 0.6, the composition of the alloy powder deviates from the eutectic composition to thereby cause the melting point to be increased, resulting in the alloy powder having a residue on melting, and the bonding strength may be lowered. On the other hand, if the value of 0.7 is exceeded, the content of Ag in the brazing material in the state in which it is heated to be melted and mixed is increased, thereby the melting point of the brazing material being increased, resulting in the brazing material having a residue on melting, and the bonding strength may be lowered.

In addition, it is desirable that the alloy powder contain 0.0001 to 0.5 mass % of Si. If the content of Si is under 0.0001 mass %, the melting point of the alloy powder is increased, thereby the alloy powder having a residue on melting, and therefore the bonding strength may be lowered. In addition, an alloy powder with which the addition amount of Si is under 0.0001 mass % is extremely expensive. On the other hand, if the value of 0.5 mass % is exceeded, a brittle Ti—Si phase is easily formed in the brazing material layer, thereby the bonding strength may be lowered.

It is desirable that the value of d50 of the alloy powder prepared by, for example, the gas atomization method, and obtained by sieving or the like be 15 to 40 μm. If the value of d50 is under 15 μm, the heated and melted brazing material in bonding is easily caused to wet-spread to the surface of the metal plate. On the other hand, if the value of d50 exceeds 40 μm, in the case where the brazing material is pasted for screen printing, or the like, the dimensional accuracy of the printing pattern cannot easily be secured. From the same viewpoint, it is more preferable that the value of d50 of the alloy particle be 20 to 30 μm.

Further, it is desirable that the value of d10 of the alloy powder be 6 to 12 μm, and that of d90 of the same be 60 μm or under. If the value of d10 of the alloy powder is under 6 μm, the melting speed is increased, and there is the possibility that the heated and melted brazing material may be caused to excessively wet-spread. The preferable value of d10 of the alloy powder is 7 to 12 μm. On the other hand, if the value of d90 exceeds 60 μm, the melting speed of the alloy powder is decreased, resulting in a part of the alloy powder having a residue on melting, thereby the bonding strength may be lowered. The preferable value of d90 of the alloy powder is 55 μm or under.

[Ag Powder]

It is preferable that an Ag powder with a d50 of 1 to 15 μm be added to the brazing material in the range of 5 to 30 pts. mass for 100 pts. wt. of the alloy powder. By adding the later described active metal hydride powder and this Ag powder as another powder to the alloy powder, the voids between particles of the alloy powder having the above-mentioned particle size distribution can be uniformly filled, whereby the fillability of the brazing material can be enhanced.

If the value of d50 of the Ag powder is under 1 μm, the difference in particle diameter between the alloy powder and the Ag powder is increased, the dispersion state of the Ag powder in the brazing material becomes non-uniform, thereby the bonding strength between the metal plate and the ceramic plate may be lowered. In addition, a printing pattern which is produced by screen-printing of a pasted brazing material may have a printing unevenness. On the other hand, if the value of d50 of the Ag powder exceeds 15 μm, the Ag powder, which can be supposed to be melted or subjected to solid phase diffusion by contacting with the alloy powder melted earlier in the course of temperature rise, has a residue on melting, thereby the bonding strength between the metal plate and the ceramic plate may be lowered. It is desirable to add an Ag powder with a value of d50 of 3 to 8 μm.

If the addition amount of the Ag powder is under 5 pts. mass, the effect of moderating the scale-like irregularities on the surface of a brazing material layer is low. On the other hand, if the value of 30 pts. mass is exceeded, there is given an effect of suppressing the occurrence of scale-like irregularities on the surface of a brazing material layer, however, the amount of Ag component which is diffused to the surface of the metal plate is increased, thereby the brazing material may be wet-spread to the surface of the metal plate. It is desirable that the addition amount of the Ag powder be in the range of 10 to 25 pts. mass.

Further, it is desirable that the value of d10 of the Ag powder be 0.5 to 3.0 μm, and that of d90 of the same be 8.0 to 20.0 μm or under. If the value of d10 of the Ag powder is under 0.5 μm, the melting speed is increased, thereby there is the possibility that the heated and melted brazing material may be excessively wet-spread. On the other hand, if the value of d90 exceeds 20.0 μm, the melting speed of the Ag powder is decreased, resulting in a part of the Ag powder having a residue on melting, thereby the bonding strength may be lowered. Further, if the value of d10 of the Ag powder exceeds 3.0 μm, or the value of d90 is under 8.0 μm, the particle size distribution of the Ag powder is too sharp, and therefore the fillability of the brazing material is relatively low, thereby the bonding strength between the ceramic substrate and the metal plate may be low.

By adding the Ag powder having the above-mentioned particle size distribution to the brazing material by an addition amount in the above-mentioned range, the voids between particles of the alloy powder can be uniformly filled with the Ag powder, whereby the fillability of the particles of the respective powders in the brazing material can be enhanced. By thus enhancing the fillability of the brazing material, the respective particles of the Ag powder contained in the brazing material are uniformly contacted with the solution of the alloy powder, which is melted earlier than the Ag powder in the course of temperature rise. Thereby, the Ag generated through the melting or solid phase diffusion of the Ag powder which has been contacted with the solution of the alloy powder can be uniformly dissolved into the solution of the alloy powder without being segregated. In addition, by adding the Ag powder having the above-mentioned particle size distribution to the brazing material by an addition amount in the above-mentioned range, the amount of coating of the brazing material can be stabilized in pasting this brazing material for printing. As a result of this, the bonding strength between the metal plate and the ceramic substrate can be more enhanced.

[Active Metal Hydride Powder]

It is preferable that an active metal hydride powder having a particle size distribution of a d50 of 10 to 25 μm, a d10 preferably of 5 to 15 μm, and a d90 of 25 to 50 μm be added to the brazing material separately from the alloy powder in the range of 0.5 to 5 pts. mass for 100 pts. wt. of the alloy powder.

If the value of d10 of the active metal hydride powder is under 5 μm or the value of d50 is under 10 μm, the dispersed situation of the powder becomes non-uniform, there occurring a portion where the particles of the powder are localized and a portion where they are depleted in the same brazing material. Therefore, in the deficiency portion, the active metal to be generated by decomposition of the active metal hydride in the course of temperature increase is insufficient. Then, the compound layer to be generated at the bonding interface between the brazing material layer and the ceramic substrate through the reaction between the element contained in the ceramic substrate and the active metal is not formed in the deficiency portion, and voids (vacancies) are formed in the deficiency portion, thereby the bonding strength may be lowered. On the other hand, if the value of d10 exceeds 15 μm, the particle size distribution is too sharp, and the fillability of the brazing material is relatively low, thereby the bonding strength between the ceramic substrate and the metal plate may be low.

If the value of d50 of the active metal hydride powder exceeds 25 μm, or if the value of d90 of the same exceeds 50 μm, the powder contains a more amount of particles having a larger particle diameter, the distribution of the particles of the active metal hydride powder in the brazing material easily becomes coarser, thereby there occurs a portion where the particles are deficient. Therefore, in the same manner as mentioned above, in the deficiency portion, the amount of the active metal is insufficient, and therefore, in the deficiency portion, the compound layer is not formed, thereby the bonding strength between the ceramic substrate and the metal plate may be lowered. On the other hand, if the value of d90 is under 25 μm, the particle size distribution of the Ag powder is too sharp, and therefore the fillability of the brazing material is relatively low, thereby the bonding strength between the ceramic substrate and the metal plate may be low.

If the addition amount of the active metal hydride powder is under 0.5 pts. mass, the compound layer based on the active metal is not sufficiently formed at the bonding interface, thereby the bonding strength between the ceramic substrate and the metal plate may be lowered. On the other hand, if the addition amount exceeds 5.0 pts. mass, a brittle Ti—Si phase is formed in the brazing material layer, resulting in the strength of the brazing material layer per se being lowered, thereby there is the possibility that the bonding strength may be lowered. From the same viewpoint, the more preferable range of the addition amount of the active metal hydride powder is 1.0 to 3.0 pts. mass.

As the active metal hydride, the hydride of an element belonging to the periodic table IVa family can be used, and generally a hydride of titanium, zirconium, or hafnium is used. Herein, in the case where the ceramic substrate is formed of a nitride-based ceramic, such as aluminum nitride or silicon nitride, or an oxide-based ceramic, such as alumina or zirconia, it is preferable to use a hydride powder of titanium (Ti), i.e., a titanium hydride powder as the active metal. Titanium generated through the decomposition of the titanium hydride at a prescribed temperature has a high reactivity with N, which is an element contained in the nitride-based ceramic, or O, which is an element contained in the oxide-based ceramic, and by forming a TiN layer or $TiO_2$ layer, which is a compound layer, at the bonding interface between the brazing material layer and the ceramic substrate, can more enhance the bonding strength.

As mentioned above, it is desirable that, as the active metal hydride powder, a titanium hydride powder be used. By a heating treatment in the bonding step, the titanium hydride is decomposed at a prescribed temperature to release hydrogen for generation of active metal titanium, and this metal titanium reacts with the element contained in the ceramic substrate to form a compound layer at the bonding interface between the ceramic substrate and the brazing material layer. And, while the melting point of the alloy powder having the above-mentioned composition is 750 to 880° C., the decomposition temperature of the titanium hydride powder is 600° C. or so, and therefore the temperature difference between both is as small as approx. 150 to 280° C. In this way, by decomposing the titanium hydride powder at a temperature which is 150 to 280° C. lower than the melting temperature of the alloy powder to generate metal titanium, a deterioration, such as oxidation or carbonization, of the metal titanium before the start of melting of the alloy powder is prevented. As a result of this, a compound layer can be properly formed at the bonding interface between the ceramic substrate and the brazing material layer, whereby the bonding strength can be more improved.

In the case where a ceramic substrate and a metal plate are bonded to each other using the above-described brazing material in accordance with the present invention, the behavior of the brazing material in bonding is not always clear, however, it is estimated as follows. In other words, first of the alloy powder, Ag powder, and active metal hydride powder contained in the brazing material, the active metal hydride powder is decomposed in the course of temperature increase in the bonding step, an active metal being generated, which is followed by the alloy powder being melted to become a solution, and with this solution of the alloy powder, the Ag powder is contacted, thereby the Ag being melted and diffused, or solid-phase diffused, into the solution. Herein, with the brazing material in accordance with the present invention, an appropriate amount of In, which can suppress formation of scale-like irregularities on the surface of the brazing material layer, is added to the alloy powder, and the Ag, which further raises the melting point, is separately added as the Ag powder. As a result of this, the melting point of the alloy powder per se is relatively low, being close to the temperature at which the active metal hydride powder is decomposed. In this way, by bringing the decomposition temperature of the active metal hydride powder close to the melting temperature of the alloy powder, it is possible to reduce chances for the active metal generated through the decomposition of the active metal hydride powder to react with oxygen, carbon, or nitrogen existing in the brazing material or in the atmosphere in the subsequent course of temperature increase to the melting point of the alloy powder, which results in an appropriate amount of the active metal existing in the brazing material.

And, as the temperature is further increased, the alloy powder starts melting, the Ag powder being brought into contact with the solution of the melted alloy powder, and the Ag being melted and diffused, or solid-phase diffused into the solution to provide a solution which is in an indistinguishably united condition. Herein, as described above, the brazing material (powder mixture) in accordance with the present invention is a powder mixture with which the respective powders having the relationship among the particle diameters of alloy powder active metal hydride powder>Ag powder are mixed, and the powder mixture has a prescribed particle size distribution, thereby the Ag powder is uniformly disposed in the voids between particles of the alloy powder. As a result of this, the respective particles of the Ag powder are uniformly contacted with the solution of the melted alloy powder, thereby the Ag can be uniformly dissolved into the solution of the alloy powder without being segregated.

And, the active metal is diffused into the above-mentioned solution and the active metal reacts with the element contained in the ceramic substrate, resulting in a compound layer being formed at the interface between the brazing material in the condition of a solution and the ceramic substrate. And, the brazing material layer formed by passing through the cooling process adheres to the ceramic substrate through the above-mentioned compound layer with a high strength, whereby a high bonding strength between the ceramic substrate and the metal plate can be realized.

[Brazing Material Paste]

The brazing material paste, which is another aspect of the present invention, is obtained by adding a binder by 1 to 10 mass %, and a solvent by 2 to 20 mass % to the above-mentioned brazing material, and kneading a resulting mixture. In order to improve the dispersibility of the brazing material and binder in the solvent, a dispersant may be added. By providing the brazing material paste with the above-mentioned composition, a brazing material paste which is suitable for screen printing, calendar printing, and the like, can be obtained. Herein, if the amount of the binder is less than 1 mass %, the shape retention of the brazing material paste is lowered, thereby the geometrical accuracy of the printing pattern may be lowered. On the other hand, if the amount of the binder exceeds 10 mass %, carbon is left in the brazing material layer formed after the brazing treatment, and voids (vacancies) are formed between the metal plate and the ceramic substrate, thereby the bonding strength between both may be lowered. If the binder is compounded in the above-mentioned range, the binder is rapidly removed in the degreasing step for removing the binder from the printed brazing material by heating, or the like, thereby it is preferable to do so.

If the amount of the solvent contained in the brazing material paste is less than 2 mass %, the fluidity of the brazing material paste is lowered, thereby in printing of the brazing material paste by screen printing, or the like, the printing pattern may have a failure, such as blurring. On the other hand, if the amount of the solvent is more than 20 mass %, the shape retention of the brazing material paste is lowered, thereby the geometrical accuracy of the printing pattern may be lowered.

The above-mentioned brazing material paste is coated on a face of the ceramic substrate in a thickness of 45 µm, and then heated for one hour at 835° C. in a vacuum of $5 \times 10^{-3}$ Pa or under, the brazing material layer formed by cooling thereafter giving a surface roughness of 25 µm or under in Rmax. In other words, if the brazing material in accordance with the present invention is used, the addition amount of In in the alloy powder is reduced, and therefore, the scale-like irregularities formed on the surface of the brazing material are moderated, thereby upon the treatment being performed under the above conditions, the value of Rmax obtained being 25 µm or under. With such a brazing material layer, formation of concave parts on the surface is suppressed, thereby the bonding interface between the metal plate and the ceramic substrate giving a void ratio of 5% or under.

The brazing material paste preferably has a viscosity of 20 to 200 Pa·s. If the viscosity is under 20 Pa·s, the fluidity of the paste is excessive, the shape retention of the brazing material paste being lowered, thereby the geometrical accuracy of the printing pattern may be lowered. On the other hand, if the viscosity exceeds 200 Pa·s, the fluidity of the paste is extremely lowered, thereby in printing of the brazing material paste by screen printing, or the like, the printing pattern may have a failure, such as blurring.

The thickness of a printing pattern provided by printing the brazing material paste is preferably 20 to 80 µm. If the thickness of the printing pattern is thinner than 20 µm, the amount of the brazing material required for bonding is insufficient, thereby voids may be produced. On the other hand, if the thickness exceeds 80 µm, the amount of the brazing material is excessive, and wet-spreading of the heated and melted brazing material is great, thereby, in the case where the metal plate is a circuit metal plate, the insulated properties between circuits may be poor.

[Ceramic Circuit Substrate]

The ceramic circuit substrate, which is still another aspect of the present invention, a ceramic circuit substrate produced by coating at least one face of a ceramic substrate with the above-mentioned brazing material paste, placing a metal plate on the brazing material paste, then heating these for one hour at 835° C. in a vacuum of $5 \times 10^{-3}$ Pa or under, and cooling thereafter to thereby bond between said ceramic substrate and the metal plate, wherein the brazing material layer of the ceramic circuit substrate has a void ratio of 5% or under. According to such a ceramic circuit substrate, since the brazing material in accordance with the present invention with which the addition amount of In in the alloy powder is reduced is used, the scale-like irregularities formed on the surface of the brazing material are moderated; the brazing material layer has avoid ratio 5% or under; and the peel strength, which is a value indicating the bonding strength between the ceramic substrate and the metal substrate, is 15 kN/m or higher, whereby a desirable bonding strength can be provided.

The temperature at which the ceramic substrate and the metal plate of the above-mentioned ceramic circuit substrate is bonded is preferably selected in the range of 770 to 880° C. If the bonding temperature is under 770° C., the brazing material is insufficiently melted, thereby voids may be formed between the metal plate and the ceramic substrate. On the other hand, if the bonding temperature exceeds 880° C., wettability of the heated and melted brazing material is great, thereby, in the case where the metal plate is a circuit metal plate, the insulated properties between circuits may be poor. The more preferable bonding temperature is 790 to 850° C.

In order to suppress the alloy powder, active metal hydride powder, and metal plate from being oxidized, and enhance the bonding strength between the ceramic substrate and the metal plate, the atmosphere for bonding both is specified to be a non-oxidizing atmosphere, the bonding treatment being performed in a vacuum or an inert gas, such as argon. In the case of a vacuum atmosphere, a heating treatment is performed for 0.3 to 3 hours in a vacuum of 1 Pa or under for bonding. If the pressure is higher than 1 Pa, and the oxygen amount in the atmosphere is large, an active metal generated from the active metal hydride powder, which is decomposed first of all in the course of temperature increase, easily reacts with oxygen to become an oxide, thereby the active metal will not play a role as such. Then, generation of a compound layer required for bonding between the ceramic substrate and the brazing material layer is suppressed, thereby voids are left at the bonding interface, resulting in the bonding strength being lowered. The pressure is more preferably 0.1 Pa or under.

In addition, the heating treatment time in bonding between the ceramic substrate and the metal plate is 0.3 to 3 hours. If the heating treatment time is shorter than 0.3 hours, the brazing material is insufficiently melted, thereby voids may be formed between the metal plate and the ceramic substrate. On the other hand, if the heating treatment time exceeds 3 hours, the heated and melted brazing material is excessively wet-spread, thereby, in the case where the metal plate is a circuit metal plate, the insulated properties between circuits may be poor. The more preferable heating treatment time is 0.5 to 1.5 hours.

It is desirable that the ceramic substrate and the metal plate be bonded to each other while a moderate load being imposed thereon. By imposing a load on the metal plate and the ceramic substrate, they are positively contacted with the brazing material, whereby the bonding strength between the metal plate and the ceramic substrate can be improved. As the load to be imposed on the ceramic substrate and the metal plate, it is preferable to use a load of 10 to 100 g per unit area (1 cm$^2$) of the brazing material (brazing material paste) to be interposed between both.

[Ceramic Master Circuit Substrate]

The ceramic master circuit substrate, which is still another aspect of the present invention, is a ceramic master circuit substrate allowing a plurality of ceramic circuit substrates to be extracted therefrom, the ceramic master circuit substrate being produced by coating the above-mentioned brazing material paste on at least one face of a ceramic substrate, placing a metal plate on the brazing material paste, then heating these for one hour at 835° C. in a vacuum of $5 \times 10^{-3}$ Pa or under, and cooling thereafter to thereby bond between said ceramic substrate and metal plate, wherein a brazing material layer of a ceramic circuit substrate extracted from said ceramic master circuit substrate has a void ratio of 5% or under, and a brazing material layer formed in an end portion within 10 mm of an end face of said ceramic master circuit substrate has a void ratio of 5% to 50%.

Herein, the ceramic master circuit substrate provides a basic size of circuit substrate in the process for manufacturing ceramic circuit substrates. In other words, the ceramic master circuit substrate is a large-sized substrate 10 which, as shown in FIG. 4, allows extraction of a plurality of ceramic circuit substrates 1 shown in FIG. 3 (9 pieces in the case of FIG. 4). The rectangular ceramic master circuit substrate 10 has a product part 6, which is a central region in which a plurality of product ceramic circuit substrates 1 are formed, and a corner portion 5, which is formed within 10 mm of an end face of the ceramic master circuit substrate around the product part 6.

The method for manufacturing this ceramic master circuit substrate is basically the same as the method for manufacturing the ceramic circuit substrate. This manufacturing method is outlined here. First, a large-sized ceramic substrate 20 and a metal plate with which a plurality of ceramic circuit substrate can be formed are prepared. Then, in the region to be used for the product part 6 in the ceramic substrate 20, the above-described brazing material paste is printed to form a plurality of sets of product patterns corresponding to circuit pattern geometries 4a to 4c of a circuit metal plate 4e is formed. In addition, in an end portion 5 of the ceramic substrate 20, the brazing material is printed to form a plurality of sets of end portion patterns corresponding to the geometries of end portion metal plates 5a. Thereafter, a large-sized metal plate is placed on the ceramic substrate 20 while being positioned in a horizontal direction so as to be contacted with the product pattern and the corner portion pattern which are printed on the ceramic substrate 20, and under the above-mentioned conditions for heating treatment, the metal plate is bonded to the ceramic substrate. Next, the metal plate bonded to the ceramic substrate 20 is patterned by etching to form a plurality of sets of circuit metal plates 4e in the product part 6 and a plurality of end portion metal plates 5a in the end portion 5 as shown in FIG. 4 for formation of the ceramic master circuit substrate 10. In the ceramic substrate 20 of the ceramic master circuit substrate 10, a break groove B corresponding to an outer edge of the ceramic circuit substrate 1 to be extracted is formed lengthwise and breadthwise, and by breaking along this break groove B, the ceramic circuit substrates 1 can be extracted respectively.

And, by using the above-described brazing material and bonding method in accordance with the present invention, voids (vacancies) are concentrated in a brazing material layer 7a which bonds the end portion metal plate 5a formed in the end portion 5 of the ceramic master circuit substrate 10 to the ceramic substrate 2, the void ratio therefor being 5 to 50%. On the other hand, generation of voids contained in brazing material layers 3a to 3c which bond the circuit metal plate 4e (4a to 4c) of the ceramic circuit substrate 1 that is formed in the product part 6 to the ceramic substrate 2 is suppressed, and the respective void ratios for the brazing material layers 3a to 3c of the ceramic circuit board 1 extracted from the ceramic master circuit substrate 10 are 5% or under.

[Power Semiconductor Module]

Still another aspect of the present invention provides a power semiconductor module produced by loading a semiconductor chip on the circuit metal plate bonded to one face of the above-mentioned ceramic circuit substrate, and bonding a heat dissipating metal plate to another face of said ceramic substrate. According to such a power semiconductor module, the stability of bonding between the circuit metal plate and the ceramic substrate, and between the heat dissipating metal plate and the ceramic substrate can be maintained, whereby a power semiconductor module which is excellent in mounting reliability against thermal cycle can be provided.

Advantage of the Invention

As described above, according to the brazing material in accordance with the present invention, the bonding strength between the ceramic substrate and the metal plate can be improved.

BRIEF DESCRIPTION OF THE DRAWINGS

FIG. 7 is a front view showing a test piece for use in a peel strength test.

BEST MODE FOR CARRYING OUT THE INVENTION

Figure 1:
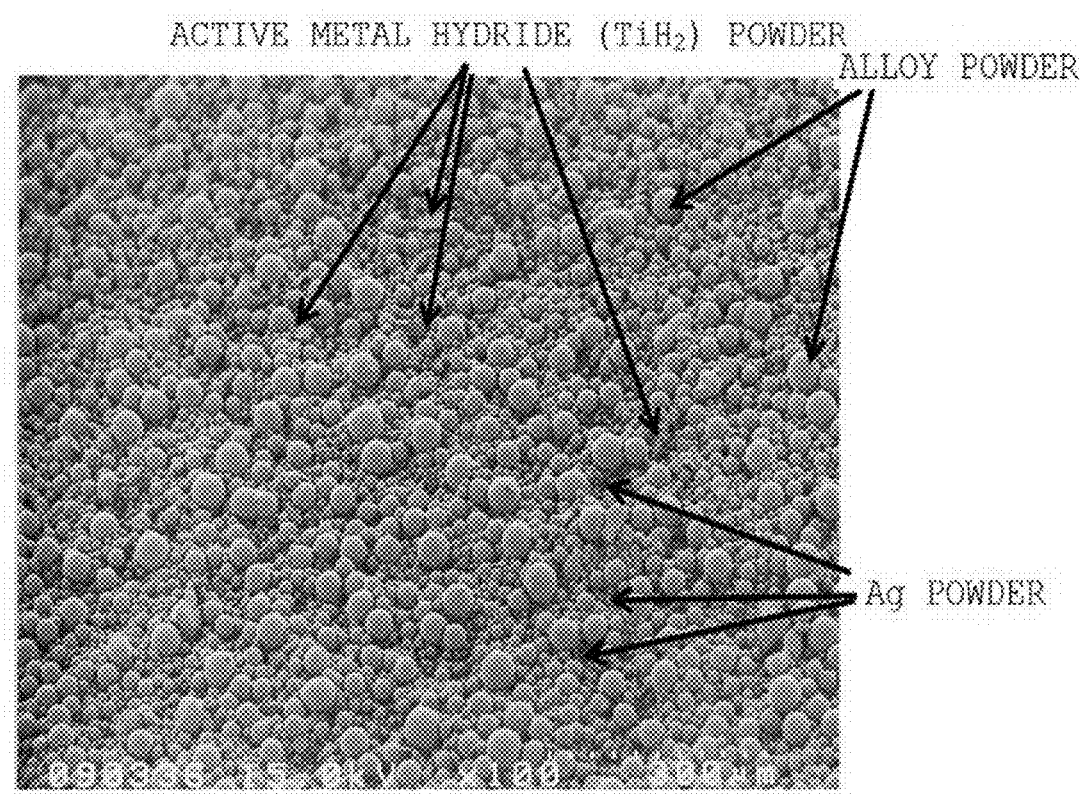
FIG. 1 is an SEM photograph showing a morphology of the particles constituting a brazing material of one example of the present invention.

Hereinbelow, preferable aspects of the present invention will be explained, however, the present invention is not limited to the aspects.

As described above, the brazing material of the present invention is a brazing material for bonding between a ceramic substrate and a metal plate, the brazing material being a powder mixture provided by mixing an alloy powder composed of at least 55 to 80 mass % of Ag, 1 to 5 mass % of In, and the balance Cu with inevitable impurities, an Ag powder, and an active metal hydride powder, a composition ratio of Ag to the total amount of Ag and Cu contained in said powder mixture, Ag/(Ag+Cu), being 0.57 to 0.85, the brazing material containing an active metal hydride powder with an equivalent circle average diameter of particles of 10 to 25 μm by 0.5 to 5.0 mass %, the equivalent circle average diameters of particles for said alloy powder, Ag powder, and active metal hydride powder meeting a relationship of alloy powder≥active metal hydride powder>Ag powder, and in the cumulative distribution in volume base given upon a measurement of the particle size distribution in conformity with JIS Z 8825-1, said powder mixture having a particle size distribution of a cumulative 10% particle diameter (d10) of 3 to 10 μm, a cumulative 50% particle diameter (d50) of 10 to 35 μm, and a cumulative 90% particle diameter (d90) of 30 to 50 μm, and in the frequency distribution, a peak existing between the cumulative 50% particle diameter (d50) and the cumulative 90% particle diameter (d90).

Specifically, the above-mentioned brazing material can be preferably obtained by mixing an alloy powder with a cumulative 50% particle diameter (d50) of 15 to 40 μm composed of 55 to 80 mass % of Ag, 1 to 5 mass % of In, 0.1 mass % or under of oxygen content, and the balance Cu with inevitable impurities; 5 to 30 pts. mass of Ag powder particles with a cumulative 50% particle diameter (d50) of 1 to 15 μm for 100 pts. mass of said alloy powder; and 0.5 to 5 pts. mass of an active metal hydride powder having a particle size distribution of a cumulative 10% particle diameter (d10) of 5 to 15 μm, a cumulative 50% particle diameter (d50) of 10 to 25 μm, and a cumulative 90% particle diameter (d90) of 25 to 50 μm. Herein, the alloy powder is prepared by using the gas atomization method for making an atomizing operation such that the value of d50 provides a target particle diameter, and removing the powder over the target particle diameter by sieving out it for using the powder having the target particle diameter. The Ag powder and the active metal hydride powder can also be obtained in the same manner.

The above-mentioned brazing material is a powder mixture of the alloy powder, Ag powder, and active metal hydride powder. The respective powders are mixed by using a stirring machine, such as a ball mill, or an attritor, and a powder mixture in the state of powder which is composed of the metal particles alone can be obtained. In addition, by adding an organic solvent and a binder to the respective powders, and using a ball mill, a planetary mixer, a three-roll mill, or the like, to mix them, a pasted brazing material (brazing material paste) can also be obtained. For pasting, it is recommended that, as the organic solvent, methyl cellosolve, ethyl cellosolve, isophorone, toluene, ethyl acetate, terpineol, diethylene glycol, monobutyl ether, Texanol, or the like, be used, and as the binder, an acrylic resin, such as polyisobutylmethacrylate, or a polymer compound, such as ethyl cellulose, or methyl cellulose, be used. Further, in pasting a brazing material, it is desirable that, as described above, the binder be added to the brazing material in the range of 1 to 10 mass %, and the solvent be added to the same in the range of 2 to 20 mass %.

As the ceramic constituting the ceramic substrate, which is a sintered body, various ceramics including, for example, aluminum oxide (alumina: $Al_2O_3$), zirconium oxide (zirconia: $ZrO_2$), and other oxide-based ceramics; aluminum nitride (AlN), silicon nitride ($Si_3N_4$), titanium nitride (TiN), and other nitride-based ceramics; silicon carbide (SiC), titanium carbide (TiC), and other carbide-based ceramics; and boride-based ceramics can be utilized as appropriate, depending upon the application and operating conditions of the circuit substrate. However, it is desirable that the ceramic substrate constituting a ceramic circuit substrate for use with a power semiconductor module (IGBT module), or the like, to which a high-voltage, large-current is applied be formed of aluminum nitride or silicon nitride, which has a high thermal conductivity, or especially silicon nitride, which has a high strength, and is excellent in fracture toughness and thermal conductivity. In the case where the ceramic substrate is formed of silicon nitride, it is preferable that the ceramic substrate be formed of a silicon nitride material having a thickness of 0.1 to 1.0 mm, and a thermal conductivity of 50 W/m·K, desirably, 70 W/m·K or over.

As the material for the metal plate to be bonded to the above-mentioned ceramic substrate, there is no special restriction, provided that it can be bonded with the above-mentioned brazing material, and the melting point of the metal plate is higher than that of the brazing material. Generally, copper, a copper alloy, aluminum, an aluminum alloy, silver, a silver alloy, nickel, a nickel alloy, nickel-plated molybdenum, nickel-plated tungsten, a nickel-plated iron alloy, or the like, can be used as the material for the metal plate. Using aluminum as the material for the metal plate is preferable, because, although aluminum is inferior to copper in electrical resistance, and high thermal conductivity (low thermal resistance), the plastic deformability of aluminum can be utilized to provide a mounting reliability against a thermal cycle. In the case where the electrical resistance is emphasized, silver can be used. In addition, in the case where the post-bonding reliability is preferred to the electrical properties, it is preferable to use molybdenum or tungsten, because the coefficients of thermal expansion of these are close to those of aluminum nitride and silicon nitride, whereby the thermal stress in bonding can be reduced. However, among these, it is preferable to use copper or a copper-based metal, such as a copper alloy, for the metal plate, from the viewpoints of electrical resistance and drawability, high thermal conductivity (low thermal resistance), less migration, and the like.

Figure 2:
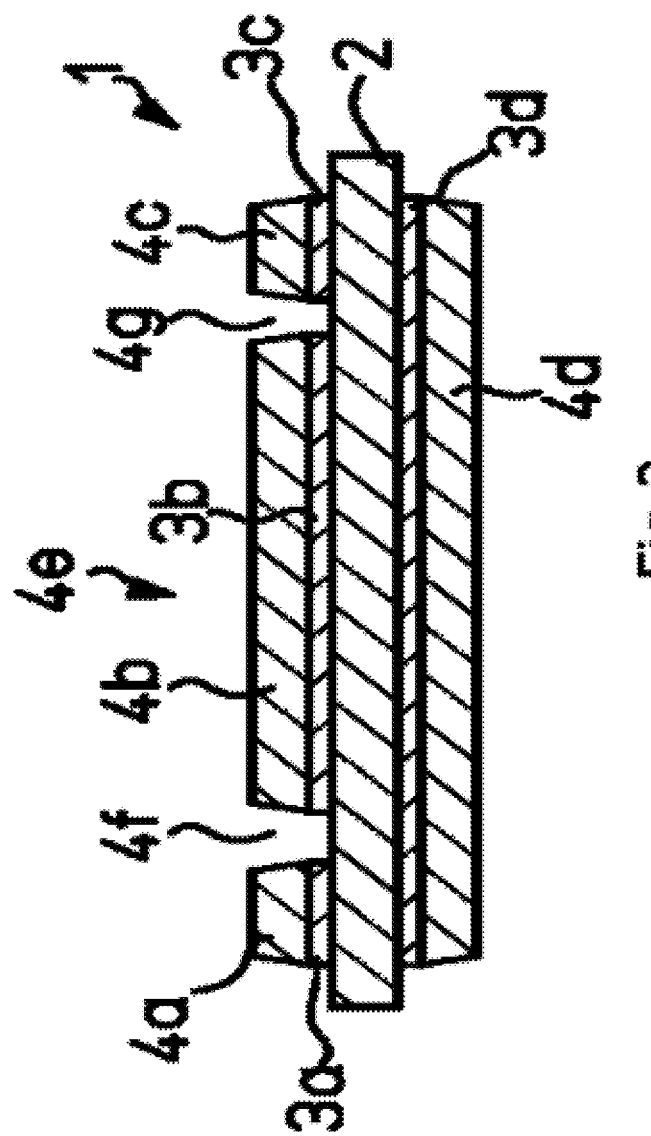
FIG. 2 is a side view showing one embodiment of a ceramic circuit substrate of the present invention.
Figure 3A:
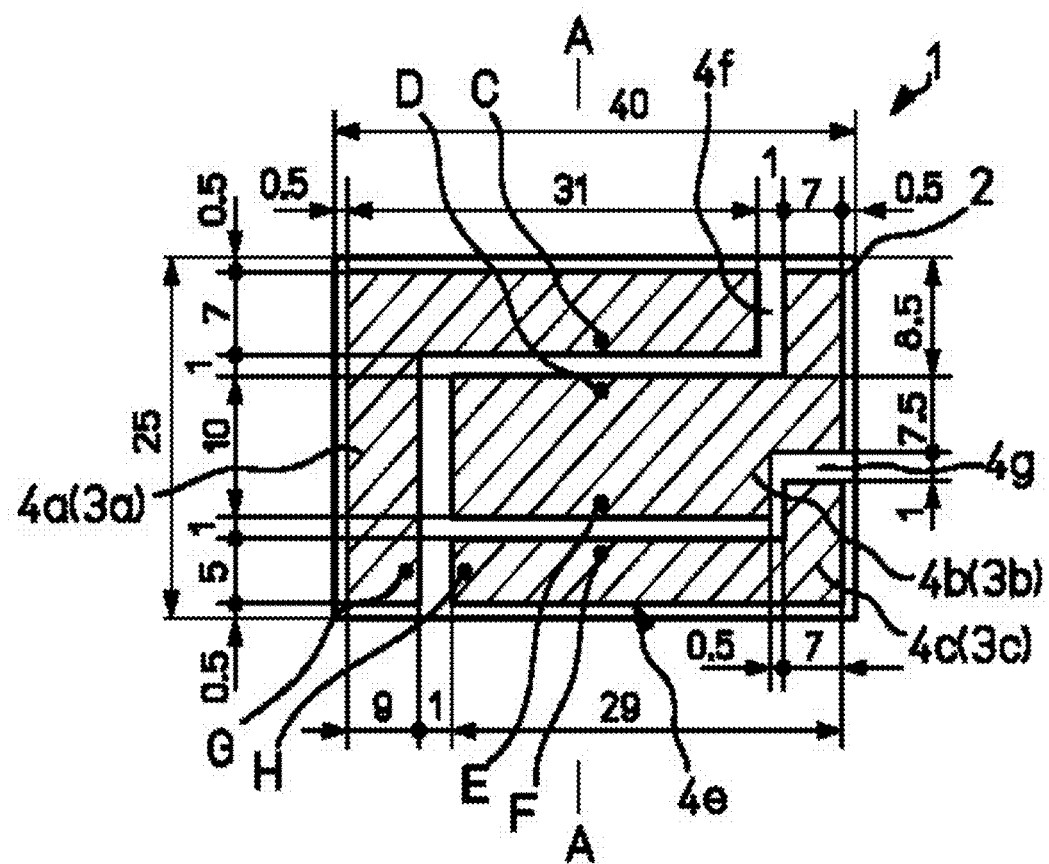
FIG. 3(a) is a top view of a figure in FIG. 2.
Figure 3B:
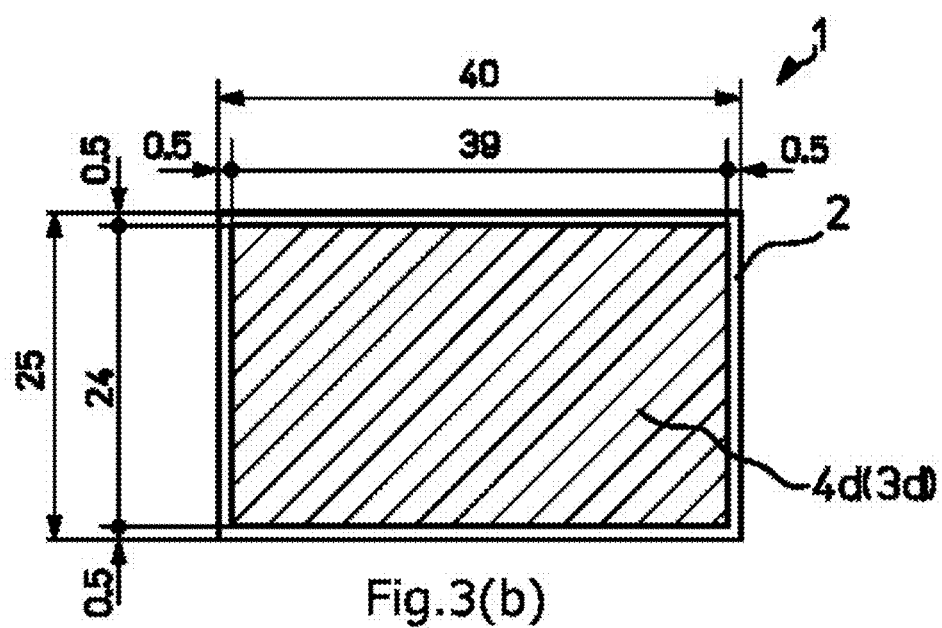
FIG. 3(b) is a bottom view of the figure in FIG. 2.

FIG. 2 and FIG. 3 show a configuration of a ceramic circuit substrate prepared by using the above-mentioned brazing material, ceramic substrate, and metal plate. FIG. 2 is an A-A sectional view of a figure in FIG. 3(a). In addition, in FIG. 3(a), which is a top view of the ceramic circuit board, and FIG. 3(b), which is a bottom view of the same, the circuit metal plate 4e (4a to 4c) and the heat dissipating metal plate 4d are shown with hatching, respectively, for ease of comprehension (this statement is also applicable to FIGS. 4 and 5).

As shown in FIGS. 2 and 3, the ceramic circuit substrate 1 has a circuit metal plate 4e composed of three metal plates 4a to 4c constituting a circuit pattern disposed on a top face (one face) of a ceramic substrate 2, and a heat dissipating metal plate 4d disposed on a bottom face (the other face). And, the respective metal plates 4a to 4c of the circuit metal plate 4e are bonded to the top face of the ceramic substrate 2 through the brazing material layers 3a to 3c, respectively, and the heat dissipating metal plate 4d is bonded to the bottom face of the ceramic substrate 2 through the brazing material layer 3d. Herein, any one of the above-mentioned brazing material layers 3a to 3d is provided by the above-mentioned brazing material being solidified after having been passed through a heating treatment in the bonding step.

Figure 4:
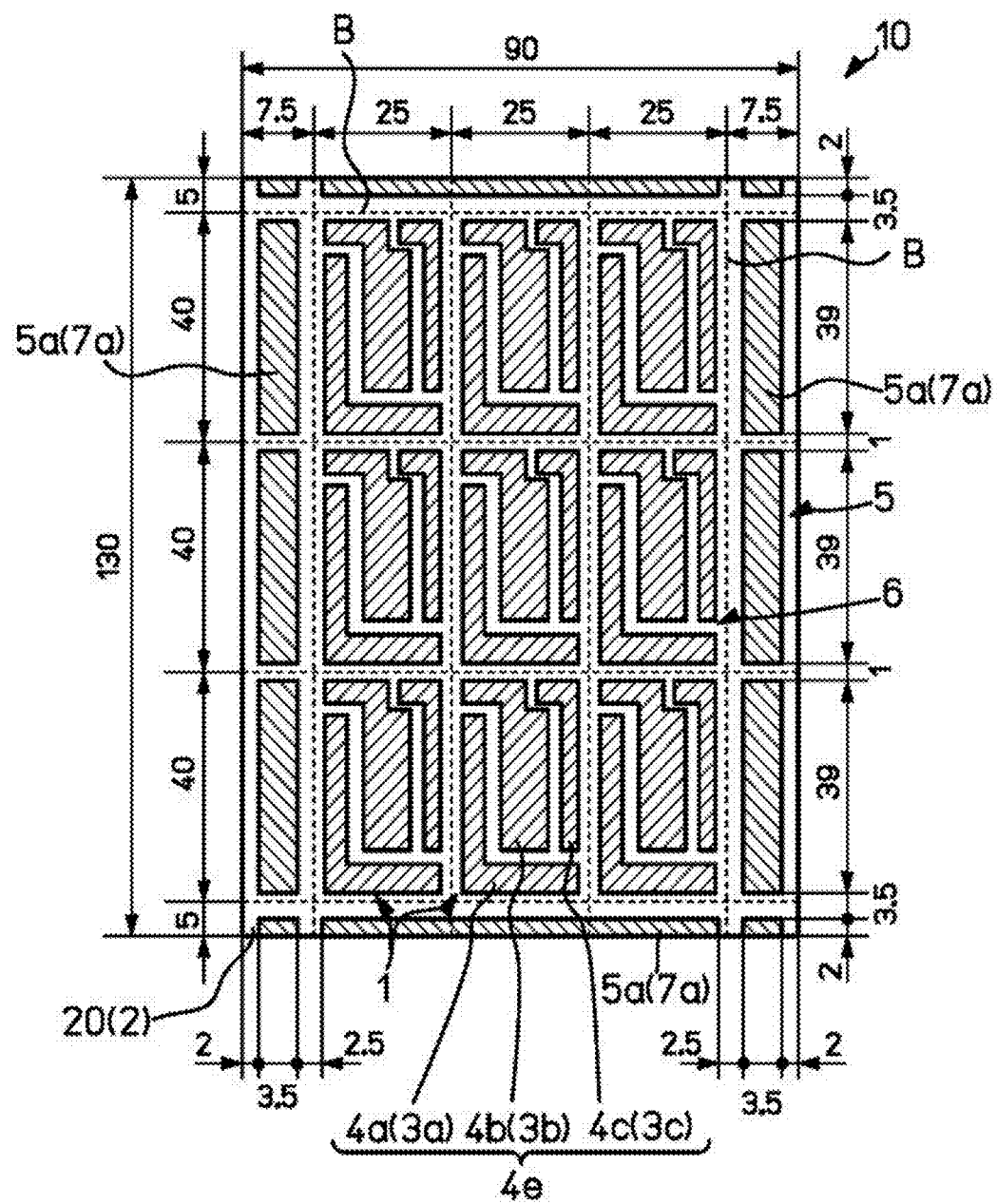
FIG. 4 is a top view showing a ceramic master circuit substrate according to one embodiment of the present invention.

Hereinbelow, with reference to FIG. 5, the method for manufacturing the above-mentioned ceramic circuit substrate 1 will be explained. The following manufacturing method is an example in the case where the ceramic master circuit board, which has been explained with reference to FIG. 4, is utilized to manufacture the ceramic circuit substrate 1, however, even in the case where the ceramic circuit substrate 1 is individually manufactured, it can be manufactured in basically the same manner. In addition, with the following manufacturing method, the pattern printing etching method is used to form the circuit pattern of the circuit metal plate 4e, however, the direct loading method or the multistage etching method may be used for forming it. Further, except for the etching step of forming the circuit pattern, the steps related to the circuit metal plate 4e and those to the heat dissipating metal plate 4d are identical, and therefore, only the steps related to the circuit metal plate 4e will be explained, and the steps related to the heat dissipating metal plate 4d will be omitted as appropriate.

Figure 5A:
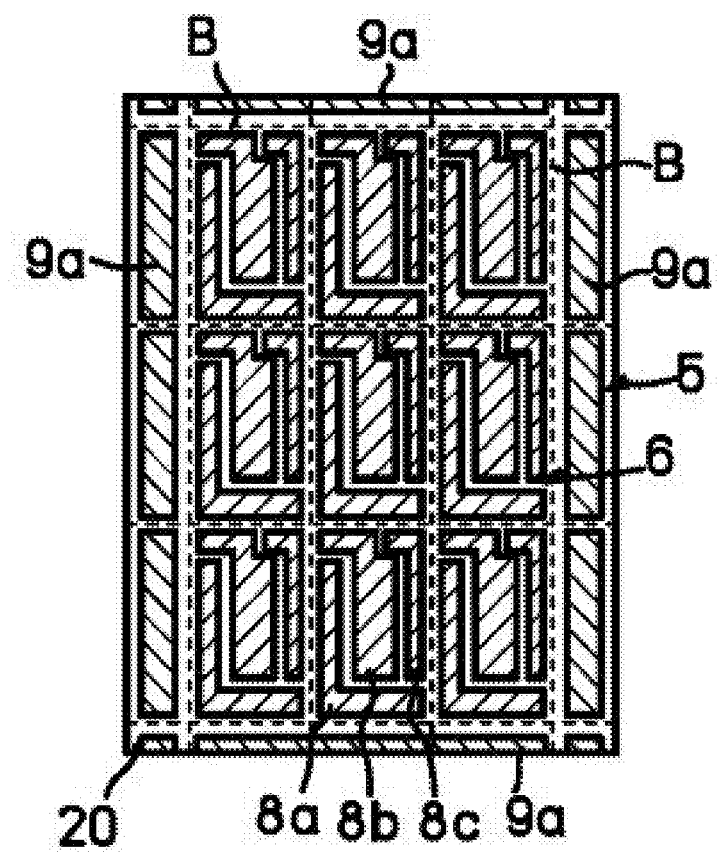
FIG. 5(a) is a figure for explaining the manufacturing method for the ceramic circuit substrate in accordance with the present invention, being a top view showing the state after a brazing material paste having been coated.

The step of coating the brazing material paste will be explained with reference to FIG. 5(a). As the method for coating the brazing material paste on the large-sized ceramic substrate 20 shown in FIG. 5(a) that constitutes the ceramic master circuit substrate, the screen printing method, the metal mask printing method, the roll coating method, and the coating method by spraying, transfer, or the like, are available. Herein, since it is difficult to coat a brazing material in the state of powder on the ceramic substrate 20 in a prescribed pattern, it is a general practice that a pasted brazing material (brazing material paste) is coated on the ceramic substrate 20 by the screen printing method, or the like.

In the case where the screen printing method is used for printing (coating) the above-mentioned brazing material paste, the brazing material paste is printed on the top face of the ceramic substrate 20 using a screen having an appropriate mesh (openings) for formation of a plurality of sets (nine sets in the figure) of product patterns 8a to 8c corresponding to the circuit pattern geometries of the circuit metal plates in the product part 6, and a plurality of (twelve in the figure) edge portion patterns 9a corresponding to the geometries of the edge portion metal plates in the edge portion 5. The edge portion patterns 9a are formed in the same manner on the bottom face of the ceramic substrate 20. By selecting a screen having a proper mesh size for printing the brazing material paste, the product patterns 8a to 8c and the edge portion patterns 9a can be produced so as to have an average thickness of 20 to 80 μm. The product patterns 8a to 8c and the edge portion patterns 9a may have a size smaller than that of the pertinent circuit pattern in consideration of the wet-spreading, and the like, of the brazing material in bonding.

Herein, if the brazing material paste contains a coarse particle, the screen can be clogged, resulting in occurrence of a printing failure, such as a blur, especially in the product patterns 8a to 8c, and therefore it is desirable that no coarse particles be contained in the brazing material paste. In the case where a fine pattern is to be printed, a fine mesh screen is used, thereby screen clogging can easily be caused. Therefore, in the case where a screen of, for example, 300 mesh is used for printing the brazing material paste, it is desirable that the value of d90 of the particles which are contained in the brazing material paste be 60 μm or under.

The degreasing step, which is performed following the step of coating the brazing material paste, will be explained. After the brazing material paste having been coated, degreasing is carried out to remove the binder component contained in the product patterns 8a to 8c and the edge portion patterns 9a. The conditions in the degreasing step, such as the heating temperature and the heating time, may vary depending upon the binder component, however, it is preferable that, as the atmosphere for degreasing treatment, an inert gas atmosphere or a vacuum atmosphere, which is a non-oxidizing atmosphere, be used for treatment, because the active metal hydride powder will not be oxidized in such an atmosphere. Even if the atmosphere is an oxidizing atmosphere, it may be used, provided that, by restricting the amount of oxygen, the active metal hydride powder is prevented from being oxidized beyond the allowable limit. In other words, degreasing may be carried out in a low oxygen concentration atmosphere or a wet atmosphere. Herein, the wet atmosphere refers to an atmosphere which is formed by passing a non-oxidizing atmosphere gas through the water or hot water before being fed to the treatment chamber. However, in order to enhance the effect provided by the addition of the active metal hydride powder to the brazing material, it is preferable that the amount of oxygen contained in the brazing material after the degreasing treatment be 0.3 mass % or under.

By using an acrylic resin, such as polyisobutylmethacrylate, as the binder to be added to the brazing material paste, and using terpineol, diethylene glycol, monobutyl ether, or the like, as the solvent, for maintaining a prescribed temperature in a preceding stage of the bonding step, the degreasing treatment can be carried out simultaneously in the bonding step with no need for separately providing the degreasing step. This scheme is preferable because the ashed carbon is practically not left in the brazing material layer, thereby the bonding strength between the ceramic substrate and the metal plate is improved. In the following Examples, the degreasing treatment was simultaneously performed in the bonding step.

Figure 5B:
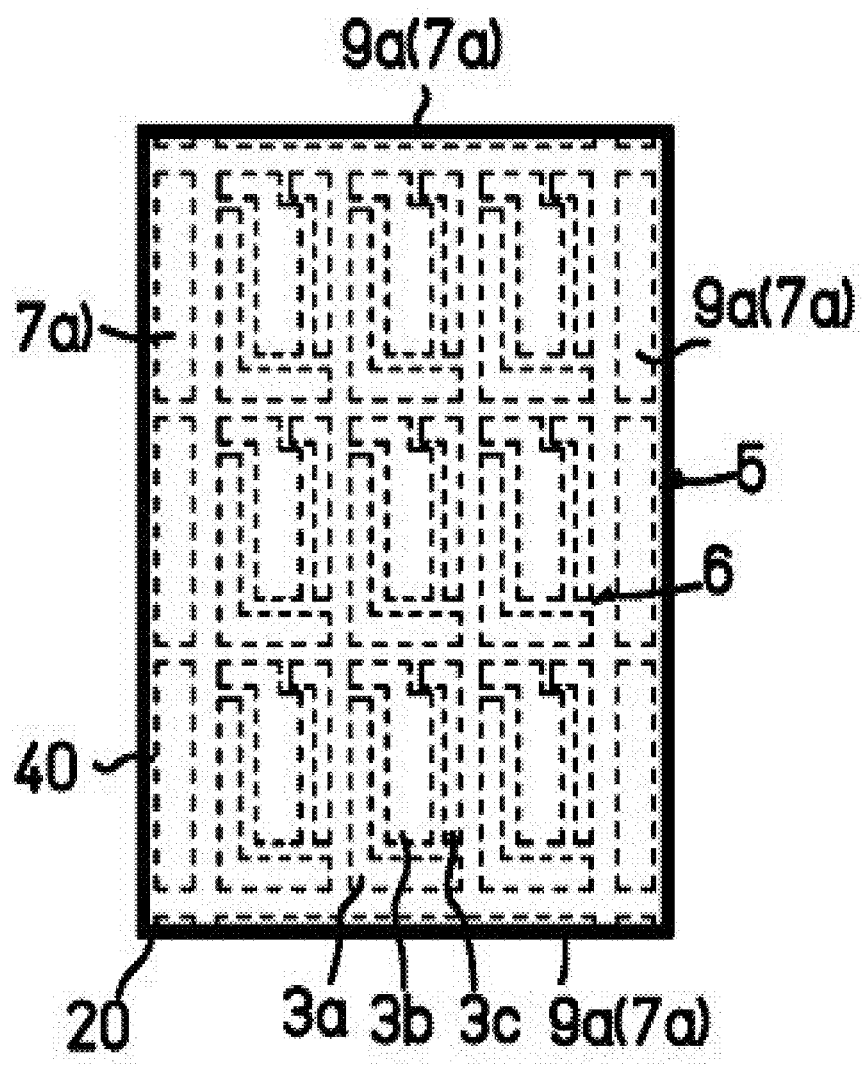
FIG. 5(b) is a figure for explaining the manufacturing method for the ceramic circuit substrate in accordance with the present invention, being a top view showing the state after a metal plate having been bonded to the ceramic substrate.

The bonding step will be explained with reference to FIG. 5(b). As shown in FIG. 5(b), a large-sized plate-like metal plate 40 for providing a circuit metal plate is placed on the top face of the ceramic substrate 20 such that the metal plate 40 is brought into contact with the product patterns 8a to 8c and the end portion patterns 9a which have been formed by coating the brazing material paste in the above-mentioned coating step. At this time, the metal plate 40 is positioned in a prescribed position with respect to the ceramic substrate 20 in the horizontal direction, the metal plate 40 being aligned such that the metal plate 40 covers all the product patterns 8a to 8c and the end portion patterns 9a, which have been formed on the top face of the ceramic substrate 20. And, also on the bottom face of the ceramic substrate 20, a metal plate for providing a heat dissipating copper plate is placed in the same manner, being aligned, and in the state in which these are laminated, is fixed and held with an appropriate jig, or the like.

By subjecting the two metal plates placed on the top and bottom faces of the ceramic substrate 20, and the ceramic substrate 20 to a heating treatment in the laminated state at a prescribed temperature for a prescribed time in a prescribed atmosphere, and thereafter cooling these, the metal plate 40 is bonded to the top face of the ceramic substrate 20 through the brazing material layers 3a to 3c, which are provided by solidification of the product patterns 8a to 8c, and the brazing material layers 5a, which are provided by solidification of the end portion patterns 9a. Herein, in the bonding step, in order to allow the heated and melted brazing material to sufficiently wet-spread to the ceramic substrate 20 and the metal plate 40, which exist in the region for providing the ceramic circuit board 10, thereby securing a sufficient bonding strength, and to suppress the thermal cycle resistance from being lowered due to a residual stress generated resulting from a difference in thermal expansion coefficient between both, it is desirable that the heating temperature be 770 to 880° C.

In order to obtain a good bonding strength without the active metal hydride powder and the copper plate being oxidized, it is preferable that, as the atmosphere for bonding treatment, a non-oxidizing atmosphere, especially, a vacuum atmosphere be used for treatment, and it is preferable to carry out bonding in a vacuum of 1 Pa or under, more desirably in a vacuum of 0.1 Pa or under. It is still more desirable that the bonding be performed, while a moderate load being imposed on the ceramic substrate 20 and the metal plates disposed on the top and bottom faces thereof in the laminated state, which, because the ceramic substrate 20 is closely adhered to the metal plates, allows a good bonding state to be obtained. As the load to be imposed, it is desirable to use a load of 10 to 100 g per unit area (1 cm$^2$) of the brazing material (brazing material paste) which is interposed between the ceramic substrate 20 and the metal plate disposed on the top or bottom thereof.

Figure 5C:
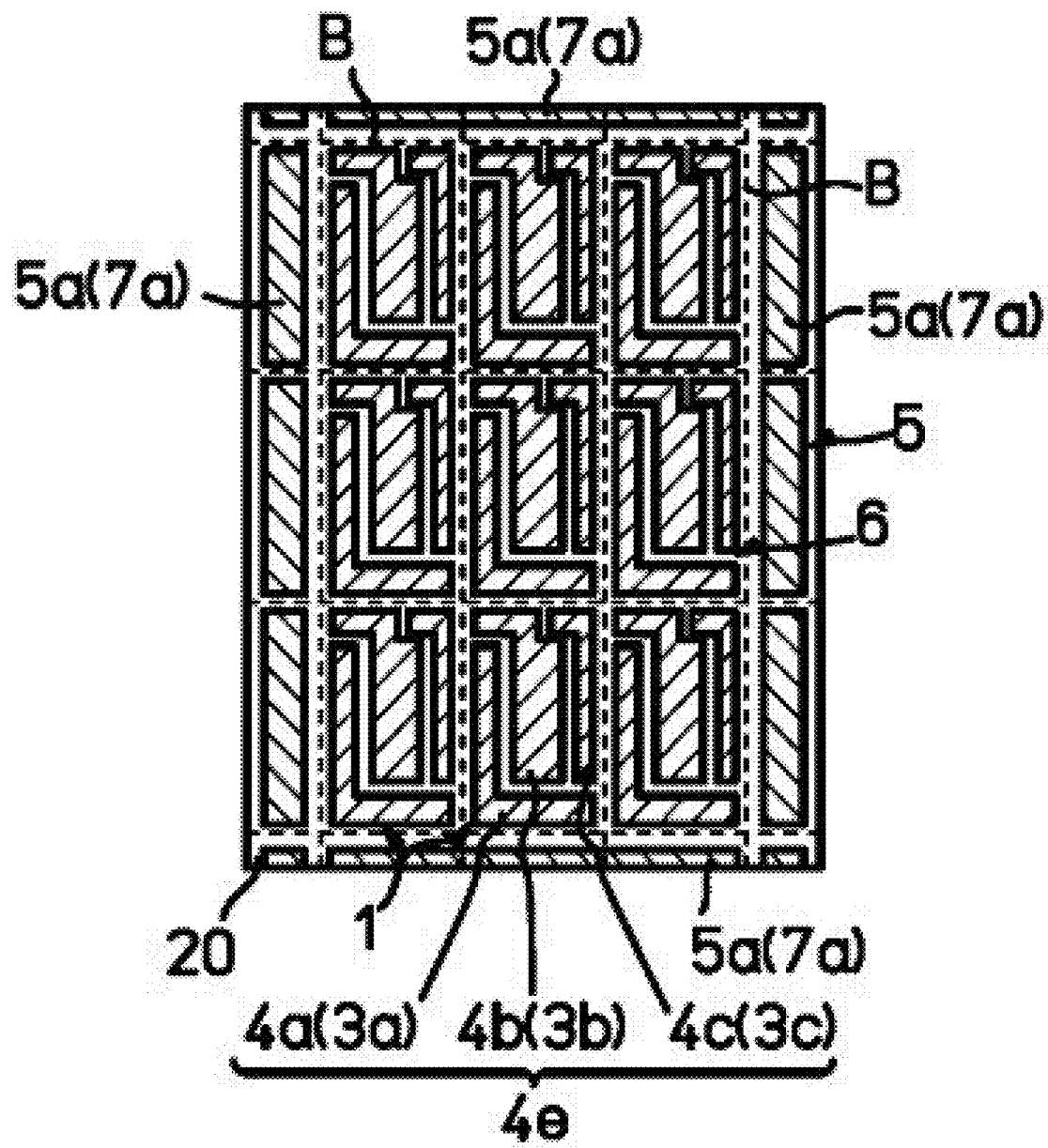
FIG. 5(c) is a figure for explaining the manufacturing method for the ceramic circuit substrate in accordance with the present invention, being a top view showing the state after a circuit pattern having been formed.

The etching step to be performed after the above-described bonding step will be explained with respect to FIG. 5(c). In the etching step, from the metal plate 40 shown in FIG. 5(b) that has been bonded to the ceramic substrate 20 in the bonding step, the unnecessary portions are removed to form a plurality of sets of circuit metal plates 4e composed of the metal plates 4a to 4c constituting the circuit pattern, and a plurality of end portion circuit boards 5a as shown in FIG. 5(c).

As the resist film which is formed on the top face of the metal plate 40 in the patterns corresponding to the geometries of the circuit metal plate 4e and the end portion metal plate 5a in the etching step, a resist of either thermal hardening type or ultra violet-curable type may be used. In addition, either the ink type or the film type may be used. The former allows a resist film having a desirable pattern to be formed, using the screen printing method, and the latter can form a desired pattern of resist film by depositing it on the surface of the metal plate 40, and then making exposure and development. After forming a resist film on the top face of the metal plate 40, the unnecessary portions of the metal plate are removed by etching with an etchant. For example, in the case where the circuit metal plate is a copper-based metal plate, it is recommended that, as the etchant, a solution in which ferric chloride ($FeCl_3$), copper chloride ($CuCl_2$), or the like, is adequately compounded be used.

Once the etching step has been completed by removing the resist film, and performing cleaning, and the like, as appropriate, there is provided a ceramic master circuit substrate 10 in which a plurality of sets of ceramic circuit substrates 1 having a circuit metal plate 4e, and a plurality of edge portion metal plates 5a have been formed. Thereafter, by breaking the ceramic master circuit board 10 with the break groove B which is previously formed lengthwise and breadthwise along the outer edge of the ceramic circuit substrate 1 in the ceramic substrate 20, and separating the ceramic circuit substrate 1 formed in that product part 6 to individuate it, an individual ceramic circuit substrate 1 can be obtained.

Besides the steps from the coating step to the etching step which have been described above, a brazing material removing step may be provided as required, for example, following the etching step, in order to remove the unnecessary brazing material layer being left between circuits of the metal plates 4a to 4c, which provide a circuit pattern, and other unnecessary brazing material layers, by using, for example, a brazing material removing liquid containing hydrogen peroxide and acidic ammonium fluoride. In addition, a foreign matter removing step may be provided for removing the foreign matters, such as carbon adhered to the surface of the circuit metal plate 4e or the ceramic substrate 20, with a cleaning agent containing an oxidant. These steps may be performed on the ceramic circuit substrate 1 which has been separated from the ceramic master circuit substrate 10, however, performing of these steps in the state of the ceramic master circuit substrate 10 is effective from the viewpoint of industrial production, and is preferable.

EXAMPLES

On the basis of Examples 1 to 3, the present invention will be specifically explained. In the following Examples 1 to 3, the ceramic master circuit substrate 10 of the dimensions shown in FIG. 4 was prepared which has nine ceramic circuit substrates 1 having the dimensions shown in FIG. 3 that are formed in the product part 6, and has the end portion 5 formed within 10 mm of the outer peripheral end. As the material for the ceramic substrate 2 (20), silicon nitride, aluminum nitride, and alumina were used, and the thickness thereof was specified to be 0.32 mm. The bending strength of a ceramic substrate made of silicon nitride was 700 MPa, the fracture toughness value thereof being 6.5 MPa$^{1/2}$; the bending strength of a ceramic substrate made of aluminum nitride was 350 MPa, the fracture toughness value being 3.5 MPa$^{1/2}$; and the bending strength of a ceramic substrate made of alumina was 350 MPa, the fracture toughness value being 4.0 MPa$^{1/2}$. In addition, as the respective metal plates forming the circuit metal plate 4e and the heat dissipating metal plate 4d, a copper-based plate (oxygen-free copper JIS H 3100, C 1020 H) was used, and the thicknesses thereof were specified to be 0.5 mm and 0.4 mm, respectively.

Example 1

In Example 1, the effectiveness of the above-described brazing material in accordance with the present invention were confirmed, and about (1) the relationship between the composition ratio between the Ag powder and the titanium hydride powder (active metal hydride powder) and the particle size distribution of the powder mixture, and the particle size distribution of the powder mixture; (2) the addition amount of Ag and In in the alloy powder; (3) the value of Ag/(Ag+Cu) in the alloy powder; (4) the quality of material of the active metal hydride; and (5) the quality of material of the ceramic substrate, the influence which is exerted on the bonding strength, and the like, was confirmed with the levels of the addition amount and the particle size distribution, and the quality of material being changed.

In Example 1, for the powder mixtures which are provided by mixing 100 pts. mass of an alloy powder containing Ag, Cu, In, oxygen and Si in a composition ratio given in Table 1, and having a particle size distribution given in Table 2 with an Ag powder and an active metal hydride powder having a particle size distribution given in Table 2, respectively, in a ratio given in Table 2, a brazing material paste which is compounded with 5 mass % of poly-isobutyl-methacrylate as the binder, 10 mass % of terpineol as the solvent, and 0.1 mass % of a dispersant in a ratio occupied in the brazing material paste; which is kneaded using a planetary mixer; and the viscosity of which is adjusted at 60 Pa·s was prepared for each experiment No. The addition amount and the kneading conditions for the binder, solvent, and the like, contained in the brazing material paste were specified to be the same also in Examples 2 and 3. In addition, Table 3 gives the particle size distribution, and the like, of the brazing material, which is a powder mixture of the alloy powder, Ag powder, and active metal hydride powder, for each experiment No., and Table 4 gives the equivalent circle average diameters of the particles of the alloy powder, Ag powder, and active metal hydride powder that were confirmed in the state of a powder mixture, and the addition amount of the active metal hydride powder for each experiment No.

TABLE 1

| Experiment No. | Ceramic plate | Alloy powder, composition | | | | | | Ag/(Ag + Cu) |
|---|---|---|---|---|---|---|---|---|
| | | Ag mass % | In mass % | Oxygen mass % | Si mass % | Cu mass % | Ti mass % | |
| 1 | Si$_3$N$_4$ | 70 | 3 | 0.05 | 0.01 | 26.94 | — | 0.72 |
| 2 | Si$_3$N$_4$ | 70 | 3 | 0.05 | 0.01 | 26.94 | — | 0.72 |
| 3 | Si$_3$N$_4$ | 70 | 3 | 0.05 | 0.01 | 26.94 | — | 0.72 |
| 4 | Si$_3$N$_4$ | 70 | 3 | 0.05 | 0.01 | 26.94 | — | 0.72 |
| 5 | Si$_3$N$_4$ | 70 | 3 | 0.05 | 0.01 | 26.94 | — | 0.72 |
| 6 | Si$_3$N$_4$ | 70 | 3 | 0.05 | 0.01 | 26.94 | — | 0.72 |
| 7 | Si$_3$N$_4$ | 70 | 3 | 0.05 | 0.01 | 26.94 | — | 0.72 |
| 8 | Si$_3$N$_4$ | 70 | 3 | 0.05 | 0.01 | 26.94 | — | 0.72 |
| 9 | Si$_3$N$_4$ | 70 | 3 | 0.05 | 0.01 | 26.94 | — | 0.72 |
| 10 | Si$_3$N$_4$ | 70 | 3 | 0.05 | 0.01 | 26.94 | — | 0.72 |
| 11 | Si$_3$N$_4$ | 70 | 3 | 0.05 | 0.01 | 26.94 | — | 0.72 |
| 12 | Si$_3$N$_4$ | 70 | 3 | 0.05 | 0.01 | 26.94 | — | 0.72 |
| 13 | Si$_3$N$_4$ | 70 | 3 | 0.05 | 0.01 | 26.94 | — | 0.72 |
| 14 | Si$_3$N$_4$ | 70 | 3 | 0.05 | 0.01 | 26.94 | — | 0.72 |

TABLE 1-continued

| Experiment No. | Ceramic plate | Alloy powder, composition | | | | | | |
|---|---|---|---|---|---|---|---|---|
| | | Ag mass % | In mass % | Oxygen mass % | Si mass % | Cu mass % | Ti mass % | Ag/(Ag + Cu) |
| 15 | $Si_3N_4$ | 55 | 3 | 0.05 | 0.3 | 41.65 | — | 0.57 |
| 16 | $Si_3N_4$ | 80 | 3 | 0.09 | 0.01 | 16.9 | — | 0.83 |
| 17 | $Si_3N_4$ | 70 | 1 | 0.05 | 0.0001 | 28.95 | — | 0.71 |
| 18 | $Si_3N_4$ | 70 | 5 | 0.05 | 0.5 | 24.45 | — | 0.74 |
| 19 | $Si_3N_4$ | 58 | 3 | 0.05 | 0.01 | 38.94 | — | 0.60 |
| 20 | $Si_3N_4$ | 61 | 3 | 0.05 | 0.01 | 35.94 | — | 0.63 |
| 21 | $Si_3N_4$ | 65 | 3 | 0.05 | 0.01 | 31.94 | — | 0.67 |
| 22 | $Si_3N_4$ | 68 | 3 | 0.05 | 0.01 | 28.94 | — | 0.70 |
| 23 | $Si_3N_4$ | 70 | 3 | 0.05 | 0.01 | 26.94 | — | 0.72 |
| 24 | $Si_3N_4$ | 70 | 3 | 0.05 | 0.01 | 26.94 | — | 0.72 |
| 25 | Alumina | 70 | 3 | 0.05 | 0.01 | 26.94 | — | 0.72 |
| 26 | AlN | 70 | 3 | 0.05 | 0.01 | 26.94 | — | 0.72 |
| 27 | $Si_3N_4$ | 90 | 3 | 0.05 | 0.01 | 6.94 | — | 0.93 |
| 28 | $Si_3N_4$ | 50 | 3 | 0.05 | 0.01 | 46.94 | — | 0.52 |
| 29 | $Si_3N_4$ | 60 | 3 | 0.05 | 0.01 | 36.94 | — | 0.62 |
| 30 | $Si_3N_4$ | 70 | 3 | 0.05 | 0.01 | 26.94 | — | 0.72 |
| 31 | $Si_3N_4$ | 37 | 30 | 0.05 | 0.01 | 32.94 | — | 0.53 |
| 32 | $Si_3N_4$ | 50 | 25 | 0.05 | 0.01 | 24.74 | 0.2 | 0.67 |
| 33 | $Si_3N_4$ | 70 | 3 | 0.05 | 0.01 | 26.94 | — | 0.72 |
| 34 | $Si_3N_4$ | 70 | 0.7 | 0.05 | 0.01 | 29.24 | — | 0.71 |
| 35 | $Si_3N_4$ | 70 | 6 | 0.05 | 0.01 | 23.94 | — | 0.75 |

TABLE 2

| Experiment No. | Alloy powder, particle size distribution | | | Alloy powder, specifications | | | | Active metal hydride powder, specifications | | | | |
|---|---|---|---|---|---|---|---|---|---|---|---|---|
| | d10 μm | d50 μm | d90 μm | Add. amount pts. mass | d10 μm | d50 μm | d90 μm | Active metal | Add. amount pts. mass | d10 μm | d50 μm | d90 μm |
| 1 | 7.2 | 20.0 | 36.2 | 10.0 | 4.8 | 10.0 | 17.7 | $TiH_2$ | 0.3 | 8.1 | 15.0 | 26.5 |
| 2 | 7.2 | 20.0 | 36.2 | 10.0 | 4.8 | 10.0 | 17.7 | $TiH_2$ | 0.6 | 8.1 | 15.0 | 26.5 |
| 3 | 7.2 | 20.0 | 36.2 | 10.0 | 4.8 | 10.0 | 17.7 | $TiH_2$ | 1 | 8.1 | 15.0 | 26.5 |
| 4 | 7.2 | 20.0 | 36.2 | 10.0 | 4.8 | 10.0 | 17.7 | $TiH_2$ | 2 | 8.1 | 15.0 | 26.5 |
| 5 | 7.2 | 20.0 | 36.2 | 10.0 | 4.8 | 10.0 | 17.7 | $TiH_2$ | 3 | 8.1 | 15.0 | 26.5 |
| 6 | 7.2 | 20.0 | 36.2 | 10.0 | 4.8 | 10.0 | 17.7 | $TiH_2$ | 4.5 | 8.1 | 15.0 | 26.5 |
| 7 | 7.2 | 20.0 | 36.2 | 10.0 | 4.8 | 10.0 | 17.7 | $TiH_2$ | 6 | 8.1 | 15.0 | 26.5 |
| 8 | 6.5 | 18.0 | 32.6 | 3.0 | 4.8 | 10.0 | 17.7 | $TiH_2$ | 1 | 8.1 | 15.0 | 26.5 |
| 9 | 6.5 | 18.0 | 32.6 | 5.0 | 4.8 | 10.0 | 17.7 | $TiH_2$ | 1 | 8.1 | 15.0 | 26.5 |
| 10 | 6.5 | 18.0 | 32.6 | 14.0 | 4.8 | 10.0 | 17.7 | $TiH_2$ | 1 | 8.1 | 15.0 | 26.5 |
| 11 | 6.5 | 18.0 | 32.6 | 20.0 | 4.8 | 10.0 | 17.7 | $TiH_2$ | 1 | 8.1 | 15.0 | 26.5 |
| 12 | 6.5 | 18.0 | 32.6 | 25.0 | 4.8 | 10.0 | 17.7 | $TiH_2$ | 1 | 8.1 | 15.0 | 26.5 |
| 13 | 6.5 | 18.0 | 32.6 | 30.0 | 4.8 | 10.0 | 17.7 | $TiH_2$ | 1 | 8.1 | 15.0 | 26.5 |
| 14 | 7.2 | 20.0 | 36.2 | 33.0 | 4.8 | 10.0 | 17.7 | $TiH_2$ | 1 | 8.1 | 15.0 | 26.5 |
| 15 | 7.6 | 21.0 | 38.0 | 10.0 | 4.8 | 10.0 | 17.7 | $TiH_2$ | 1 | 8.1 | 15.0 | 26.5 |
| 16 | 7.2 | 20.0 | 36.2 | 10.0 | 4.8 | 10.0 | 17.7 | $TiH_2$ | 1 | 8.1 | 15.0 | 26.5 |
| 17 | 6.5 | 18.0 | 32.6 | 10.0 | 4.8 | 10.0 | 17.7 | $TiH_2$ | 1 | 8.1 | 15.0 | 26.5 |
| 18 | 6.5 | 18.0 | 32.6 | 10.0 | 4.8 | 10.0 | 17.7 | $TiH_2$ | 1 | 8.1 | 15.0 | 26.5 |
| 19 | 7.2 | 20.0 | 36.2 | 10.0 | 4.8 | 10.0 | 17.7 | $TiH_2$ | 1 | 8.1 | 15.0 | 26.5 |
| 20 | 7.2 | 20.0 | 36.2 | 10.0 | 4.8 | 10.0 | 17.7 | $TiH_2$ | 1 | 8.1 | 15.0 | 26.5 |
| 21 | 7.2 | 20.0 | 36.2 | 10.0 | 4.8 | 10.0 | 17.7 | $TiH_2$ | 1 | 8.1 | 15.0 | 26.5 |
| 22 | 7.2 | 20.0 | 36.2 | 10.0 | 4.8 | 10.0 | 17.7 | $TiH_2$ | 1 | 8.1 | 15.0 | 26.5 |
| 23 | 7.2 | 20.0 | 36.2 | 10.0 | 4.8 | 10.0 | 17.7 | $ZrH_2$ | 1 | 8.1 | 15.0 | 26.5 |
| 24 | 7.2 | 20.0 | 36.2 | 10.0 | 4.8 | 10.0 | 17.7 | $HfH_2$ | 1 | 8.1 | 15.0 | 26.5 |
| 25 | 7.2 | 20.0 | 36.2 | 10.0 | 4.8 | 10.0 | 17.7 | $TiH_2$ | 1 | 8.1 | 15.0 | 26.5 |
| 26 | 7.2 | 20.0 | 36.2 | 10.0 | 4.8 | 10.0 | 17.7 | $TiH_2$ | 1 | 8.1 | 15.0 | 26.5 |
| 27 | 7.2 | 20.0 | 36.2 | 10.0 | 4.8 | 10.0 | 17.7 | $TiH_2$ | 1 | 8.1 | 15.0 | 26.5 |
| 28 | 7.2 | 20.0 | 36.2 | 10.0 | 4.8 | 10.0 | 17.7 | $TiH_2$ | 1 | 8.1 | 15.0 | 26.5 |
| 29 | 7.2 | 20.0 | 36.2 | — | — | — | — | $TiH_2$ | 1 | 8.1 | 15.0 | 26.5 |
| 30 | 7.2 | 20.0 | 36.2 | — | — | — | — | $TiH_2$ | 1 | 8.1 | 15.0 | 26.5 |
| 31 | 7.2 | 20.0 | 36.2 | — | — | — | — | Ti pwd. | 2.1 | 4.3 | 8.0 | 14.1 |
| 32 | 14.5 | 40.0 | 72.4 | 5.2 | 0.5 | 1.0 | 1.8 | — | — | — | — | — |
| 33 | 7.2 | 20.0 | 36.2 | 10.0 | 4.8 | 10.0 | 17.7 | $TiH_2$ | 8 | 8.1 | 15 | 26.5 |
| 34 | 7.2 | 20.0 | 36.2 | 10.0 | 4.8 | 10.0 | 17.7 | $TiH_2$ | 1 | 8.1 | 15 | 26.5 |
| 35 | 7.2 | 20.0 | 36.2 | 10.0 | 4.8 | 10.0 | 17.7 | $TiH_2$ | 1 | 8.1 | 15 | 26.5 |

TABLE 3

Powder mixture, particle size distribution

| Experiment No. | d10 μm | d50 μm | d60 μm | d80 μm | d90 μm | Peak particle diameter μm | (d50 − d10)/ (d90 − d10) — | (d50 − d10)/ 40% μm/% | Bulk density g/cm³ |
|---|---|---|---|---|---|---|---|---|---|
| 1 | 4.5 | 16.9 | 20.3 | 28.8 | 34.8 | 26.3 | 0.4 | 0.3 | 4.98 |
| 2 | 4.5 | 16.9 | 20.3 | 28.8 | 34.8 | 26.3 | 0.4 | 0.3 | 4.97 |
| 3 | 4.5 | 16.9 | 20.3 | 28.8 | 34.7 | 26.2 | 0.4 | 0.3 | 4.96 |
| 4 | 4.5 | 16.8 | 20.2 | 28.7 | 34.7 | 26.2 | 0.4 | 0.3 | 4.94 |
| 5 | 4.5 | 16.8 | 20.2 | 28.7 | 34.6 | 26.1 | 0.4 | 0.3 | 4.91 |
| 6 | 4.5 | 16.8 | 20.1 | 28.6 | 34.5 | 26.0 | 0.4 | 0.3 | 4.87 |
| 7 | 4.5 | 16.7 | 20.1 | 28.5 | 34.4 | 26.0 | 0.4 | 0.3 | 4.83 |
| 8 | 4.2 | 15.7 | 18.9 | 26.8 | 32.4 | 24.4 | 0.4 | 0.3 | 5.11 |
| 9 | 4.1 | 15.6 | 18.7 | 26.6 | 32.1 | 24.2 | 0.4 | 0.3 | 5.10 |
| 10 | 4.1 | 15.1 | 18.1 | 25.7 | 31.0 | 23.4 | 0.4 | 0.3 | 5.06 |
| 11 | 4.0 | 14.8 | 17.7 | 25.1 | 30.3 | 22.9 | 0.4 | 0.3 | 5.03 |
| 12 | 4.0 | 14.5 | 17.4 | 24.7 | 29.8 | 22.5 | 0.4 | 0.3 | 5.01 |
| 13 | 3.9 | 14.3 | 17.2 | 24.3 | 29.4 | 22.2 | 0.4 | 0.3 | 5.00 |
| 14 | 4.3 | 15.5 | 18.6 | 26.4 | 31.8 | 24.1 | 0.4 | 0.3 | 4.89 |
| 15 | 4.7 | 17.7 | 21.2 | 30.1 | 36.4 | 27.5 | 0.4 | 0.3 | 4.91 |
| 16 | 4.5 | 16.9 | 20.3 | 28.8 | 34.7 | 26.2 | 0.4 | 0.3 | 4.96 |
| 17 | 4.1 | 15.3 | 18.4 | 26.1 | 31.4 | 23.7 | 0.4 | 0.3 | 5.07 |
| 18 | 4.1 | 15.3 | 18.4 | 26.1 | 31.4 | 23.7 | 0.4 | 0.3 | 5.07 |
| 19 | 4.5 | 16.9 | 20.3 | 28.8 | 34.7 | 26.2 | 0.4 | 0.3 | 4.96 |
| 20 | 4.5 | 16.9 | 20.3 | 28.8 | 34.7 | 26.2 | 0.4 | 0.3 | 4.96 |
| 21 | 4.5 | 16.9 | 20.3 | 28.8 | 34.7 | 26.2 | 0.4 | 0.3 | 4.96 |
| 22 | 4.5 | 16.9 | 20.3 | 28.8 | 34.7 | 26.2 | 0.4 | 0.3 | 4.96 |
| 23 | 4.5 | 16.9 | 20.3 | 28.8 | 34.7 | 26.2 | 0.4 | 0.3 | 4.96 |
| 24 | 4.5 | 16.9 | 20.3 | 28.8 | 34.7 | 26.2 | 0.4 | 0.3 | 4.96 |
| 25 | 4.5 | 16.9 | 20.3 | 28.8 | 34.7 | 26.2 | 0.4 | 0.3 | 4.96 |
| 26 | 4.5 | 16.9 | 20.3 | 28.8 | 34.7 | 26.2 | 0.4 | 0.3 | 4.96 |
| 27 | 4.5 | 16.9 | 20.3 | 28.8 | 34.7 | 26.2 | 0.4 | 0.3 | 4.96 |
| 28 | 4.5 | 16.9 | 20.3 | 28.8 | 34.7 | 26.2 | 0.4 | 0.3 | 4.96 |
| 29 | 4.6 | 17.7 | 21.2 | 30.2 | 36.4 | 27.5 | 0.4 | 0.3 | 5.00 |
| 30 | 4.6 | 17.7 | 21.2 | 30.2 | 36.4 | 27.5 | 0.4 | 0.3 | 5.00 |
| 31 | 4.6 | 17.5 | 21.0 | 29.9 | 36.0 | 27.2 | 0.4 | 0.3 | 4.97 |
| 32 | 8.8 | 33.7 | 40.5 | 57.6 | 69.5 | 52.5 | 0.4 | 0.3 | 3.86 |
| 33 | 4.5 | 16.7 | 20.0 | 28.4 | 34.2 | 25.9 | 0.4 | 0.3 | 4.78 |
| 34 | 4.5 | 16.9 | 20.3 | 28.8 | 34.7 | 26.2 | 0.4 | 0.3 | 4.96 |
| 35 | 4.5 | 16.9 | 20.3 | 28.8 | 34.7 | 26.2 | 0.4 | 0.3 | 4.96 |

TABLE 4

Powder mixture, equivalent circle average diameter

| Experiment No. | Alloy powder Equiv. circle average dia. μm | Ag powder Equiv. circle average dia. μm | Active metal hydride powder Equiv. circle average dia. μm | Active metal hydride powder Addition amount mass % | Ag/(Ag + Cu) mass % |
|---|---|---|---|---|---|
| 1 | 20.3 | 9.9 | 14.9 | 0.27 | 0.73 |
| 2 | 20.1 | 9.9 | 15.0 | 0.54 | 0.73 |
| 3 | 20.0 | 9.8 | 15.0 | 0.90 | 0.73 |
| 4 | 20.1 | 10.0 | 14.8 | 1.79 | 0.73 |
| 5 | 19.8 | 10.3 | 15.1 | 2.65 | 0.73 |
| 6 | 20.0 | 9.9 | 15.2 | 3.93 | 0.73 |
| 7 | 19.9 | 10.0 | 15.1 | 5.17 | 0.73 |
| 8 | 17.8 | 9.8 | 14.9 | 0.96 | 0.71 |
| 9 | 18.3 | 10.0 | 14.9 | 0.94 | 0.71 |
| 10 | 18.2 | 10.0 | 14.9 | 0.87 | 0.74 |
| 11 | 18.2 | 10.1 | 15.0 | 0.83 | 0.75 |
| 12 | 18.0 | 10.2 | 15.1 | 0.79 | 0.76 |
| 13 | 18.0 | 9.9 | 15.2 | 0.76 | 0.77 |
| 14 | 20.0 | 10.0 | 15.3 | 0.75 | 0.77 |
| 15 | 21.1 | 10.0 | 15.1 | 0.90 | 0.59 |
| 16 | 19.9 | 9.9 | 14.8 | 0.90 | 0.82 |
| 17 | 18.0 | 10.0 | 15.0 | 0.90 | 0.73 |
| 18 | 17.9 | 10.2 | 15.0 | 0.90 | 0.73 |
| 19 | 20.1 | 10.0 | 14.9 | 0.90 | 0.62 |
| 20 | 20.1 | 10.0 | 15.0 | 0.90 | 0.65 |
| 21 | 20.1 | 10.1 | 15.1 | 0.90 | 0.68 |
| 22 | 20.0 | 10.1 | 15.0 | 0.90 | 0.71 |
| 23 | 20.0 | 10.0 | 15.0 | 0.90 | 0.73 |

TABLE 4-continued

| | Powder mixture, equivalent circle average diameter | | | | |
|---|---|---|---|---|---|
| | Alloy powder | Ag powder | Active metal hydride powder | | |
| Experiment No. | Equiv. circle average dia. μm | Equiv. circle average dia. μm | Equiv. circle average dia. μm | Addition amount mass % | Ag/(Ag + Cu) mass % |
| 24 | 19.8 | 9.8  | 15.2 | 0.90 | 0.73 |
| 25 | 20.2 | 10.2 | 15.2 | 0.90 | 0.73 |
| 26 | 20.3 | 10.0 | 15.0 | 0.90 | 0.73 |
| 27 | 20.0 | 9.9  | 14.9 | 0.90 | 0.91 |
| 28 | 20.0 | 9.9  | 14.9 | 0.90 | 0.55 |
| 29 | 20.1 | —    | 15.0 | 0.99 | 0.62 |
| 30 | 20.2 | —    | 14.8 | 0.99 | 0.72 |
| 31 | 20.1 | —    | —    | —    | 0.53 |
| 32 | 39.9 | 1.0  | —    | —    | 0.52 |
| 33 | 20.1 | 9.8  | 15.0 | 6.78 | 0.73 |
| 34 | 19.8 | 10.1 | 15.0 | 0.90 | 0.73 |
| 35 | 20.0 | 10.0 | 15.3 | 0.90 | 0.73 |

The particle size distributions and the equivalent circle average diameters of the alloy powders and other respective powders, the bulk densities of the powder mixtures for the brazing materials, and the addition amounts of the active metal hydride in the brazing materials, and the like, in Example 1 that are given in Tables 1 to 4 were confirmed as follows. Further, they were confirmed in the same manner also in Examples 2 and 3, which will be explained below. In the case where the brazing material is pasted, it is recommended to remove the binder and solvent contained in the brazing material paste at an appropriate heating temperature in a vacuum atmosphere before making the confirmation.

(1) Particle Size Distribution

The particle size distributions of the alloy powder, Ag powder, and active metal hydride powder, and those of the powder mixture produced by mixing these were confirmed in conformity with JIS Z 8825-1, using a laser diffraction type particle size measuring apparatus (manufactured by NIKKISO CO., LTD., type: MT3300). In addition, the particle size distributions of the active metal hydride powder were confirmed in conformity with JIS Z 8825-1, using a laser diffraction type particle size measuring apparatus (manufactured by HORIBA, Ltd., type: LA-920).

(2) Bulk Density

The bulk densities of the powder mixture were confirmed in conformity with JIS Z 2504, using a bulk density measuring apparatus (manufactured by TSUTSUI SCIENTIFIC INSTRUMENTS CO., LTD.).

(3) Equivalent Circle Average Diameter

The equivalent circle average diameters of the particles of the alloy powder, Ag powder, and active metal hydride powder were determined as follows. First, a sample which was optionally sampled from the powder mixture was placed on a carbon tape disposed on the surface of the sample table, the positions of the respective particles in the sample being fixed, and thereafter, the respective particles were observed using an electron beam probe microanalyzer (EPMA). And, in the field of view of 0.5×0.5 mm that was selected with reference to the positioning mark formed on the surface of the sample table, component analysis was performed on Cu, Ag, Ti, Hf and Zr, and on the basis of the component analysis data provided by mapping the distributions of the respective elements, the particle in which the Ag and Cu are contained were identified as an alloy particle, the particle mainly formed of Ag was identified as an Ag powder, and the particle mainly formed of Ti, Hf, or Zr was identified as an active metal hydride powder. Next, with a scanning type electron microscope (SEM), image data was acquired on the basis of the positioning mark on the sample table in the same field of view as that mentioned above. And, with the image data being collated with the above-mentioned mapped component analysis data, 50 particles of each of the alloy powder, Ag powder, and active metal hydride powder were optionally sampled from the same field of view, respectively. With the component analysis data and the image data being confirmed, the particles which are supposed to be contacted with one another, or overlayed one upon another were excluded from the sampling. On the basis of the image data for the respective particles of the alloy powder, Ag powder, and active metal hydride powder that were sampled as above, the area of each particle was calculated, and from that area, the equivalent circle diameter of that particle was determined. Next, for six fields of view, the determination was performed in the same manner as above to obtain data for the equivalent circle diameters of 300 particles of each of the alloy powder, Ag powder, and active metal hydride powder, and the average value was adopted as the equivalent circle average diameter for each experiment No.

(4) Addition Amount of Active Metal Hydride

The addition amount (in mass %) of the active metal hydride contained in the brazing material was calculated by measuring the content of Ti in the brazing material through the analysis using a high-frequency plasma emission analysis device (IRIS Advantage, manufactured by Thermo Jarrel Ash), and multiplying the obtained value for Ti by 1.0426 on the basis of the chemical formula weight.

In Example 1 as well as the following Examples 2 and 3, the brazing material prepared for each experiment No. was used, and the steps from the coating step for the brazing material paste to the etching step described above were performed under the same conditions for each experiment No. to form the ceramic master circuit substrate 10 shown in FIG. 4. First, in the coating step for the brazing material paste, the brazing material paste was printed on a large-sized ceramic substrate made of silicon nitride, alumina, or aluminum nitride having a size of 130 mm long×90 mm wide×0.32 mm thick by screen printing using a screen mask having a mesh size of 150 count; on the top face (one face) thereof, the product patterns 8a to 8c and the end portion patterns 9a shown in FIG. 5(a) were formed; and also on the bottom face (the other face) thereof, a pattern for bonding the heat dissipating metal plate (not shown) was formed. The thickness of the respective patterns was specified to be 45 μm, and the dimensions in the planar direction were specified to be 0.2 mm smaller than the dimensions of the circuit metal plate 4e shown in FIG. 4 and those of the heat dissipating metal plate 4d shown in FIG. 3(b). The ceramic substrate 20 coated with the brazing material paste was heated for 30 minutes at a temperature of 120° C. in the atmosphere to remove the solvent contained in the brazing material paste.

Figure 8:
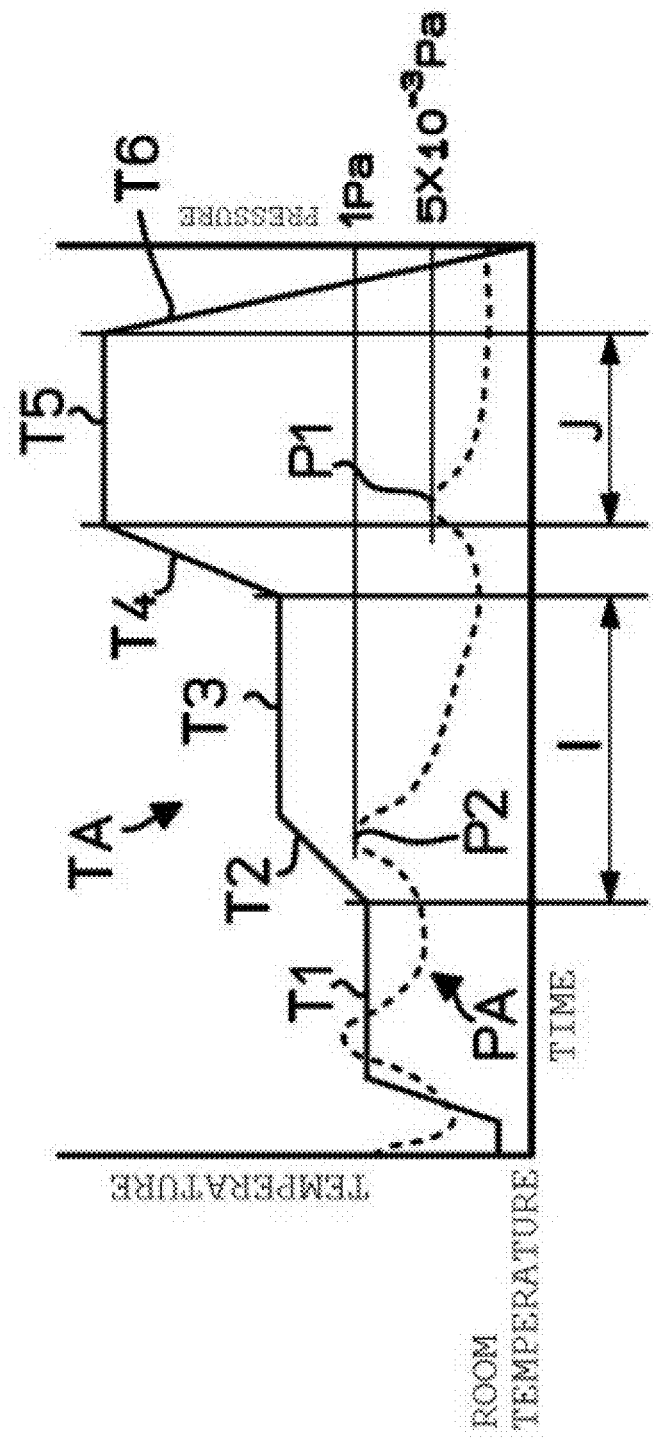
FIG. 8 is a diagram giving a temperature pattern and a pressure pattern in bonding between the ceramic substrate and the metal plate.

Next, in the bonding step, as shown in FIG. 5(b), the large-sized metal plate 40 for providing a circuit metal plate was superposed on the top face of the ceramic substrate 20, and the large-sized metal plate (not shown) for providing a heat dissipating metal plate was superposed on the bottom face of the ceramic substrate 20, and with the internal conditions of the bonding furnace being controlled such that the temperature pattern TA indicated with a solid line and the pressure pattern PA indicated with a broken line in FIG. 8 are obtained, the heating treatment was performed to bond the metal plates to the ceramic substrate. Herein, the temperature holding region T1, which appears first in the temperature pattern TA, provides a temperature region for performing the degreasing treatment to remove the binder contained in the brazing material, where the temperature of 380° C. was held for 12 hours. In the present Example 1 and the later described Examples 2 and 3, the degreasing treatment was simultaneously performed in the bonding step as described above, however, in the case where the degreasing step is separately provided before the bonding step, there is no need for providing the temperature holding region T1.

Following the temperature holding region T1, where the degreasing treatment is performed, the furnace temperature was increased at a rate of 10° C./min (the temperature rising part T2), and thereafter, the temperature of 580° C., which is under the decomposition temperature of the active metal hydride, was held for 10 hours (the temperature holding region T3). As indicated with the pressure pattern PA, in the time zone I for the temperature holding region T3, the bonding furnace was controlled such that the pressure in the furnace was 1 Pa or under. The temperature holding region T3 is a temperature region which is provided such that, by lowering the pressure in the furnace at the final period therefor, the pressure in the furnace in the later-described temperature holding region T5 is $5 \times 10^{-3}$ Pa. Therefore, if the bonding furnace has an exhausting capacity, the temperature holding region T3 is not always required to be provided. However, if the temperature holding region T3 is provided, the temperature distribution in the furnace becomes uniform, whereby the variation in the decomposed state of the active metal hydride powder depending upon the location in the subsequent temperature rising part T4 can be preferably prevented from occurring. Further, in the case where the temperature holding region T3 is provided, it is preferable that the pressure in the furnace in the time zone I therefore be set at 1 Pa or under to thereby prevent a deterioration of the active metal contained in the active metal hydride powder, such as oxidation thereof.

Following the above-described temperature holding region T3, the furnace temperature was raised at a rate of 10° C./min (the temperature rising part T4), and thereafter, the temperature of 835° C. was held for 1 hour (the temperature holding region T5), which was followed by cooling at a rate of 3° C./rain (the cooling region T6), thereby a bonded assembly in which the metal plates are bonded on the top and bottom faces of the ceramic substrate 20 was obtained. As indicated with the pressure pattern PA, in the time zone J of the temperature holding region T5, the bonding furnace was controlled such that the pressure in the furnace was $5 \times 10^{-3}$ Pa or under.

In the etching step, in the bonded assembly obtained as described above, on the surface of the large-sized metal plate for providing a circuit metal plate that is disposed on the top face side thereof, a resist film for the patterns corresponding to the circuit metal plate 4e (metal plates 4a to 4c) and the end portion metal plates 5a shown in FIG. 5(c) was formed, and on the surface of the large-sized metal plate for providing a heat dissipating metal plate that is disposed on the bottom face side thereof, a resist film for the pattern corresponding to the heat dissipating metal plate was formed. Thereafter, by spraying ferric chloride ($FeCl_3$) as an etchant onto the metal plates for removing the unnecessary portions of the metal plates to obtain a ceramic master circuit substrate in which, on the top face side of the ceramic substrate 20, nine sets of circuit metal plates 4e and a plurality of end portion metal plates 5a are disposed, and on the bottom face side (not shown), nine sets of heat dissipation metal plates are disposed.

The various characteristics of the brazing material, ceramic circuit substrate, and test piece for each experiment No. that were obtained in the above-described Example 1 are as given in Table 5. The various characteristics of the ceramic circuit substrates and the test pieces in Example 1 that are given in Table 5 were confirmed as follows. The confirmation was performed also in Examples 2 and 3, which will be explained below.

The surface roughness of the brazing material layer was determined as follows. A ceramic substrate was prepared which has the same composition as that of the ceramic substrate constituting the ceramic circuit substrate for each experiment No., and dimensions of 50 mm long×30 mm wide. On the face of the ceramic substrate, the same brazing material paste as the brazing material paste which was used for each experiment No. was coated so as to have dimensions of 40 mm long×20 mm wide, and a thickness of 45 μm. And, the ceramic substrate coated with the brazing material paste was subjected to a heating treatment under the same conditions as those giving the temperature pattern and pressure pattern explained with reference to FIG. 8 to prepare a test piece in which the brazing material layer is formed, being exposed on the surface of the ceramic substrate. And, the surface roughness (Rmax) of the brazing material layer formed was confirmed in conformity with JIS B 0601, using a surface roughness measuring apparatus (SURFCOM 130A, manufactured by TOKYO SEIMITSU CO., LTD.).

The bonding strength between the ceramic substrate and the metal plate was confirmed by conducting the following peel strength test. A ceramic substrate 21 and a metal plate 41 which have the same compositions as those of the ceramic substrate and the metal plate constituting the ceramic circuit substrate for each experiment No. were prepared. And, as shown in FIG. 7, on the top face of the ceramic substrate 21, the same brazing material paste as the brazing material paste used for each experiment No. was coated in dimensions of 20×2 mm, and the metal plate 41 was superimposed on the ceramic substrate 21 through the brazing material paste such that one edge portion of the metal plate 41 was protruded 5 mm with respect to the side face of the ceramic substrate 21. Then, these were bonded under the same bonding conditions as those for each experiment No. to prepare a test piece T in which the metal plate 41 was bonded to the ceramic substrate 21 through a brazing material layer 31. And, the protruded portion of the metal plate 41 of this test piece T was drawn upward at an angle of 90 deg using an autograph (manufactured by Shimazu Corporation, AG-G), and the force (in kN) required when the metal plate 41 was peeled off from the ceramic substrate 21 was measured, the value (in kN/m) of the force per unit length (in m) being determined as the peel strength.

The void ratio of the voids contained in the brazing material layers 3a to 3c formed in the product part 6 of the ceramic master circuit substrate 10 and that of the voids contained in the brazing material layers 7a formed in the end portion 5 shown in FIG. 4 were determined as follows. First, the ceramic master circuit substrate 10 was immersed in the solvent, and the areas of the voids in all the brazing material layers 3a to 3d on the top and bottom faces in the product part 6, and all the brazing material layers 7a on the top and bottom faces in the end portion 5 were measured, using an ultrasonic Tomography (manufactured by Hitachi Construction Machinery Co., Ltd., Mi-scope; frequency: 50 MHz). And, the void ratio for the product part 6 (in other words, the ceramic circuit substrate) was calculated by dividing the value given by summing the areas of the voids confirmed in all the brazing material layers 3a to 3d by the area of all the brazing material layers 3a to 3d. In addition, the void ratio for the corner portion 5 was calculated by dividing the value given by summing the areas of the voids confirmed in all the brazing material layers 7a by the areas of all the brazing material layers 7a.

The inter-circuit insulated properties test failure ratio, the circuit pattern dimensional failure ratio, and the thermal cycle test failure ratio for the ceramic circuit substrate were confirmed as follows. For each experiment No., 22 ceramic master circuit substrates from each of which 9 ceramic circuit substrates can be extracted were prepared, and for 198 ceramic circuit substrates obtained, the inter-circuit insulated properties test, the circuit pattern dimension inspection, and the thermal cycle test were conducted, the ratio at which a failure occurred being defined as the failure ratio.

(1) Inter-Circuit Insulated Properties Test

The inter-circuit insulated properties test is a test in which, for each of the three sets of metal plates 4a and 4b; 4a and 4c; and 4b and 4c which are opposed to each other across a gap 4f or 4g of the metal plates 4a to 4c constituting the circuit pattern of the circuit metal plate 4e formed on the top face of the ceramic circuit substrate 1 as shown in FIG. 3(a), electrode terminals are contacted with the pertinent two of the prescribed measuring points C to H to confirm that the resistance value given when 1000 Vdc is applied for 30 seconds is 1 GΩ) or higher. For example, for the metal plates 4a and 4b, which are opposed across the gap 4f, the electrode terminals are contacted with the measuring points C and D, respectively, to confirm the insulated resistance across C and D. Also for the metal plates 4b and 4c, which are opposed across the gap 4g, and the metal plates 4a and 4c, which are opposed across the gap 4f, the insulated resistance across the measuring points E and F, and that across G and H were confirmed in the same manner, respectively. And, the ceramic circuit substrate with which the resistance value across any measuring points was under 1 GΩ was determined to be defective. In the case where, in the bonding step, the wet-spreading in the horizontal direction of the brazing material is great, the width of the gap 4f or 4g between two of the brazing material layers 3a to 3c shown in FIG. 2 is decreased, thereby the insulated resistance being lowered.

(2) Circuit Pattern Dimension Inspection

In the circuit pattern dimension inspection, the dimension (0.5 mm in the figure) between the outer edge of the ceramic substrate 2 of the ceramic circuit substrate 1 and the outer edge of the circuit metal plate 4e and that between the outer edge of the ceramic substrate 2 of the same and the heat dissipating metal plate 4d shown in FIGS. 3(a) and 3(b) were measured using a micrometer microscope, and if any of the dimensions measured is not between 0.25 to 0.75 mm, the ceramic circuit substrate was determined to be defective. In the bonding step which has been explained with reference to FIG. 5(b), in the case where the melted brazing material has been wet-spread to be adhered even to the surface of the metal plate disposed on the top or bottom face of the ceramic substrate, the adhered brazing material prevents the metal plate from being etched in the subsequent etching step explained with reference to FIG. 5(c), thereby especially between the outer edge of the ceramic substrate 2 and the circuit metal plate 4e, and between the outer edge of the ceramic substrate 2 and the outer edge of the heat dissipating metal plate 4d, a dimension failure can easily be caused.

(3) Thermal Cycle Test

For the thermal cycle test, the temperature raising/lowering cycle composed of cooling for 30 min at −55° C. and heating for 30 min at 160° C. is defined as one cycle. This test cycle is repeated 1000 times for the ceramic circuit substrate, and if even a part of the circuit metal plate or heat dissipating metal plate is peeled off from the ceramic substrate, the ceramic circuit substrate was determined to be defective.

TABLE 5

| Experiment No. | Surface roughness (Rmax) μm | Peel strength kN/m | Void ratio Product part % | Void ratio End portion % | Inter-circuit insulation test failure rate % | Circuit pattern dimensional reject rate % | Thermal cycle test failure rate % |
|---|---|---|---|---|---|---|---|
| 1 | 25 | 15 | 5 | 39 | 0 | 0 | 4.0 |
| 2 | 20 | 20 | 4 | 35 | 0 | 0 | 3.0 |
| 3 | 15 | 22 | 3 | 23 | 0 | 0 | 1.0 |
| 4 | 20 | 26 | 2 | 22 | 0 | 0 | 0 |
| 5 | 20 | 29 | 2 | 21 | 0 | 0 | 0 |
| 6 | 22 | 24 | 2 | 18 | 0.5 | 0 | 0.5 |
| 7 | 24 | 20 | 4 | 45 | 3.0 | 0 | 3.0 |
| 8 | 25 | 16 | 5 | 38 | 0 | 0 | 4.0 |
| 9 | 23 | 19 | 4 | 42 | 0 | 0 | 3.0 |
| 10 | 19 | 25 | 3 | 41 | 0 | 0 | 0 |
| 11 | 19 | 26 | 3 | 20 | 0 | 0 | 0 |
| 12 | 18 | 24 | 3 | 41 | 1.0 | 0.5 | 0.5 |
| 13 | 16 | 19 | 4 | 33 | 2.0 | 1.5 | 2.0 |
| 14 | 15 | 16 | 5 | 33 | 3.5 | 3.0 | 3.5 |
| 15 | 17 | 18 | 5 | 34 | 0 | 0 | 3.5 |
| 16 | 17 | 28 | 2 | 18 | 4.0 | 2.5 | 0 |
| 17 | 18 | 20 | 4 | 45 | 0 | 0 | 1.5 |
| 18 | 19 | 25 | 3 | 20 | 0.5 | 1 | 0.5 |
| 19 | 18 | 20 | 2 | 37 | 0 | 0 | 2.5 |
| 20 | 17 | 23 | 2 | 28 | 0 | 0 | 1.0 |
| 21 | 19 | 26 | 2 | 26 | 0 | 0 | 0 |
| 22 | 18 | 27 | 2 | 22 | 0 | 0 | 0 |
| 23 | 23 | 18 | 3 | 36 | 0 | 0 | 2.5 |
| 24 | 24 | 16 | 4 | 41 | 0 | 0 | 4.5 |
| 25 | 20 | 15 | 4 | 39 | 0 | 0 | 100 |
| 26 | 16 | 21 | 2 | 25 | 0 | 0 | 15.0 |
| 27 | 28 | 11 | 8 | 23 | 8.0 | 11.0 | 15.0 |
| 28 | 35 | 12 | 9 | 38 | 0 | 0 | 19.0 |
| 29 | 53 | 10 | 15 | 57 | 0 | 0 | 24 |
| 30 | 56 | 8 | 13 | 62 | 0 | 0 | 21.5 |
| 31 | 59 | 9 | 26 | 69 | 21.0 | 18.0 | 29.0 |
| 32 | 58 | 9 | 39 | 74 | 17.5 | 16 | 39.5 |
| 33 | 38 | 13 | 4 | 33 | 3 | 0 | 16.5 |
| 34 | 26 | 12 | 8 | 66 | 0 | 0 | 14.0 |
| 35 | 52 | 13 | 14 | 45 | 1.5 | 3.5 | 22.0 |

From Example 1, the followings were confirmed. In other words, any of the test pieces formed using the brazing material pastes containing the brazing materials in accordance with the present invention in the experiments Nos. 1 to 26 offered a surface roughness (Rmax) of the brazing material layer of 25 μm or under. And, the void ratio for the product part (ceramic circuit board) that was confirmed with the ceramic master circuit boards formed in the experiments Nos. 1 to 26 was as low as 5% or under, and the void ratio for the edge portion was in the range of 5 to 50%. As a result of this, the peel strength (bonding strength) between the ceramic substrate and the metal plate in the test pieces formed using the brazing material pastes containing the brazing materials in the experiments Nos. 1 to 26 was 15 kN/m or over, and the thermal cycle test failure ratio for the ceramic circuit substrate extracted from the ceramic master circuit substrate was 5% or under. In addition, since the wet-spreading of the heated and melted brazing material in bonding was appropriate, the inter-circuit insulated properties test failure ratio and the circuit pattern dimensional reject ratio for the ceramic circuit substrate were 5% or under.

On the other hand, in the case where the brazing materials for the experiments Nos. 27 to 35 with which a part of the conditions does not meet the requirements of the present invention were used, the thermal cycle test failure rate was high, resulting from an insufficient peel strength (bonding strength), or the like, and the inter-circuit insulated properties test failure rate or the circuit pattern dimensional reject rate was high due to excessive wet-spreading as described below.

In the experiment No. 27, 10 pts. mass of the Ag powder was added to 100 pts. mass of an alloy powder with an Ag content of 90%, resulting in a composition ratio of Ag to the total amount of the Ag and Cu contained in the powder mixture, Ag/(Ag+Cu), being 0.91, and a residue on melting being produced due to a high melting temperature of the brazing material, thereby the peel strength was low, and further the wet-spreading of the brazing material was excessive, all of the thermal cycle test failure ratio, the inter-circuit insulated properties test failure ratio and the circuit pattern dimensional reject ratio being high.

In the experiment No. 28, 10 pts. mass of the Ag powder was added to 100 pts. mass of an alloy powder with an Ag content of 50%, resulting in the value of Ag/(Ag+Cu) being 0.55, and the high content of Cu caused the bonding strength between the brazing material layer and the metal plate to be lowered, thereby the peel strength was low, and the thermal cycle test failure ratio was high.

In the experiments Nos. 29 and 30, in which the Ag powder was not added, the surface roughness (Rmax) of the brazing material layer was large, and the void ratio of the product part was high, thereby the peel strength being low, and the thermal cycle test failure ratio being high.

In the experiment No. 31, in which the brazing material disclosed in Patent Document 1 was used, the content of In in the alloy powder is high, and a metal titanium powder is added to the alloy powder, thereby the surface roughness (Rmax) of the brazing material layer was coarse, and the void ratio of the product part was high, resulting in the peel strength being low, and the thermal cycle test failure ratio being high. In addition, in the experiment No. 32, in which the brazing material disclosed in Patent Document 2 was used, the content of Ti is low for the high content of In in the alloy powder, and the particle diameter of the Ag powder is small for the particle diameter of the alloy powder, thereby an improvement being added to the invention disclosed Patent Document 1, however, the surface roughness (Rmax) of the brazing material layer was coarse, resulting in the peel strength being low, and the thermal cycle test failure ratio being high.

In the experiment No. 33, in which, by adding 8 pts. mass of a titanium hydride powder for 100 pts. mass of an alloy powder, the addition amount of titanium hydride in the powder mixture is increased to 6.8 mass %, the addition amount of titanium hydride contained in the powder mixture is high, and inside of the brazing material layer formed, a brittle Ti—Si phase is excessively formed, thereby the strength of the brazing material layer per se was low. Therefore, the peel strength was decreased, and the thermal cycle test failure ratio was high. In addition, because the addition amount of titanium hydride is high, the wettability of the brazing material was excessive, resulting in the inter-circuit insulated properties test failure ratio being high.

In the experiment No. 34, because the content of In contained in the alloy powder is low, the melting point of the brazing material is increased, resulting in a residue on melting of the brazing material being produced, thereby the peel strength was low, and the thermal cycle test failure ratio was high. On the other hand, in the experiment No. 35, because the content of In contained in the alloy powder is high, the surface roughness (Rmax) of the brazing material layer was coarse, with the void ratio of the product part being high, resulting in the peel strength being low, and the thermal cycle test failure ratio being high. In addition, because the melting point of the brazing material is excessively lowered, the wet-spreading of the brazing material was excessive, thereby both the inter-circuit insulated properties test failure ratio and the circuit pattern dimensional reject ratio were high.

In addition, from the experiments Nos. 1 to 16, the followings were confirmed; first, from the experiments Nos. 1 to 7, it was confirmed that, if the addition amount of the active metal hydride powder in the powder mixture is 0.25 to 5.50 mass %, the advantage of the present invention can be provided. The powder mixture containing the above-mentioned range of addition amount of the active metal hydride powder can be preferably formed by adding 0.3 to 6 pts. mass of the active metal hydride powder for 100 pts. mass of the alloy powder. The desirable range of addition amount of the active metal hydride powder in the powder mixture is 0.40 to 4.50 mass %, and further desirably, 0.90 to 2.70 mass %. The active metal hydride powder accounts for a low proportion of the brazing material, and therefore, it was confirmed that, if the level of the addition amount is changed within the above-mentioned range, the change has practically no effect on the particle size distribution of the powder mixture.

From the experiments Nos. 3 and 8 to 14, it was confirmed that, if the addition amount of the Ag powder is 3.0 to 33.0 pts. mass for 100 pts. mass of the alloy powder, the advantage of the present invention can be provided, and the desirable addition amount is 5.0 to 30.0 pts. mass, and further desirably, 10.0 to 25.0 pts. mass.

From the experiments Nos. 3 and 15 to 18, it was confirmed that, by holding the contents of Ag, In, and Cu in the alloy powder to within the respective prescribed ranges, the advantage of the present invention can be provided.

From the experiments Nos. 3 and 19 to 22, it was confirmed that, by holding the value of ratio of Ag to the total amount of Ag and Cu contained in the alloy powder, Ag/(Ag+Cu), to within 0.6 to 0.7, the peel strength becomes higher, whereby the thermal cycle test failure ratio can be decreased.

Further, from the experiments Nos. 23 to 26, it was confirmed that, even in the case where a powder containing hafnium hydride ($HfH_2$) or zirconium hydride ($ZrH_2$) other than titanium hydride ($TiH_2$) as the active metal is used, and a ceramic substrate formed of alumina or aluminum nitride other than silicon nitride is used as the ceramic substrate, by bonding between the ceramic substrate and the metal plate, using the brazing material constituted as above, a desirable peel strength can be obtained. With the ceramic circuit substrate having a ceramic substrate formed of alumina or aluminum nitride, the bending strength and the fracture toughness of the ceramic substrate are low, thereby in the ceramic substrate per se, cracks initiated in the thermal cycle test, and the thermal cycle test failure ratio was high.

Figure 6A:
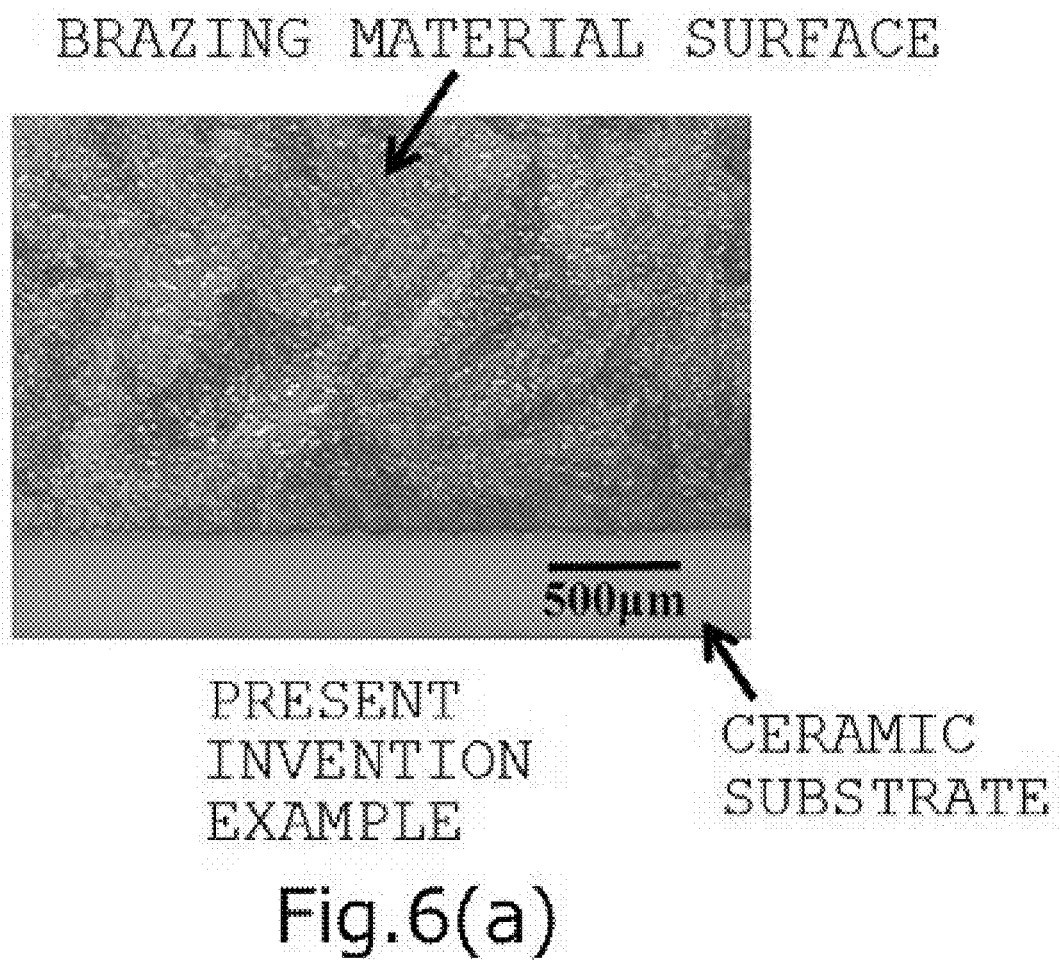
FIG. 6(a) is a stereoscopic microscope photograph showing the state of the brazing material layer after a copper plate having been bonded to a ceramic substrate in accordance with the present invention.
Figure 6B:
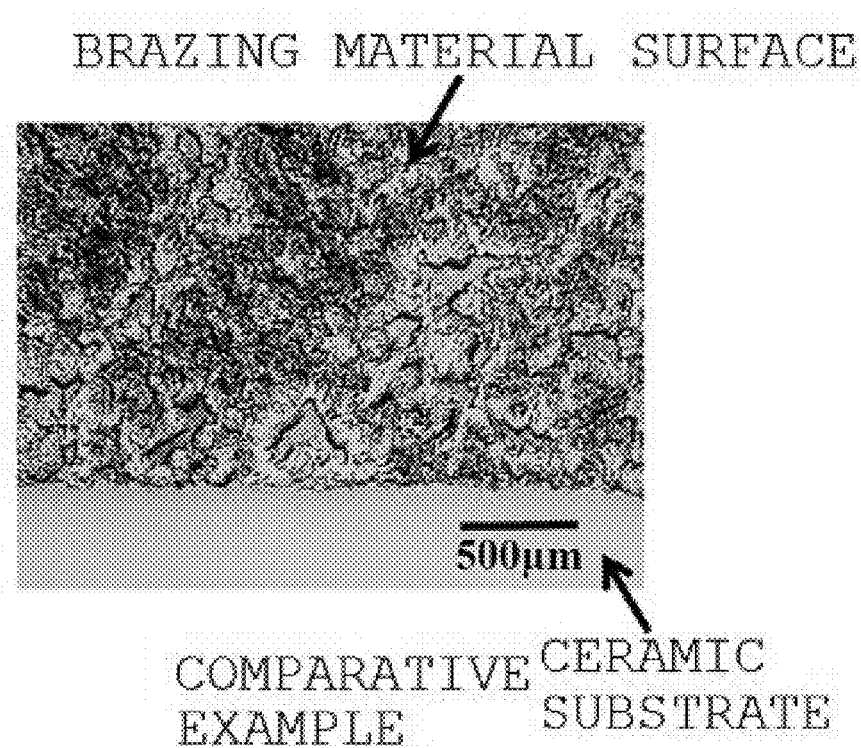
FIG. 6(b) is a stereoscopic microscope photograph showing the condition of the brazing material layer after a copper plate having been bonded to a ceramic substrate according to a conventional example.

Herein, using the brazing material paste in accordance with the present invention, and the brazing material paste disclosed in Patent Document 1, a test piece for confirming the surface roughness of the above-mentioned brazing material layer and a test piece for confirming the peel strength were prepared on the surface of a ceramic substrate formed of silicon nitride according to the test piece preparation method. FIGS. 6(a) and 6(b) show the observation result of the surface of the brazing material layer formed on the test piece for confirming the surface roughness of the brazing material layer.

FIG. 6(a) is a stereomicroscope photograph of 20 times showing the surface condition of the brazing material layer formed using the brazing material in accordance with the present invention. The respective particle size distributions of the alloy powder composed of 65.5 mass % of Ag, 2 mass % of In, 0.05% of oxygen content, and the balance Cu with inevitable impurities, the Ag powder, and the titanium hydride (active metal hydride) powder are as follows, and for 100 pts. mass of the alloy powder, 15 pts. mass of the Ag powder and 2 pts. mass of the titanium hydride powder were added.

Alloy powder d10: 8.7 μm, d50: 24.2 μm, and d90: 45.5 μm

Ag powder d10: 2.7 μm, d50: 5.6 μm, and d90: 9.9 μm

Titanium hydride powder d10: 10.1 μm, d50: 18.7 μm, and d90: 33.0 μm

FIG. 6(b) is a stereomicroscope photograph of 20 times showing the surface condition of the brazing material layer formed using a brazing material based on the conventional example given in Patent Document 1. The respective specifications for the alloy powder and the titanium powder of the brazing material used are as follows, and the compounding ratio between the alloy powder and the titanium powder was 98:2.

Alloy powder (composition): 37 mass % of Ag, 30 mass % of In, 0.05% of oxygen content, and the balance Cu, and (particle size distribution): d10: 8.7 μm, d50: 24.2 μm, and d90: 45.5 μm.

Titanium powder d50: 8.0 μm

As shown in FIG. 6(b), with the brazing material layer formed of the brazing material in the conventional example in Patent Document 1 that does not contain Ag particles and an active metal hydride, scale-like irregularities are formed on substantially all over the surface thereof, and the surface roughness (Rmax) of the brazing material layer was 25 μm or over. And, the peel strength of the test piece prepared by using the brazing material disclosed in Patent Document 1 was 10 kN/m or under.

On the other hand, as shown in FIG. 6(a), with the brazing material layer formed of the brazing material in accordance with the present invention, scale-like irregularities were practically not formed on the surface thereof, and the roughness of the surface of the brazing material layer was 25 μm or under. And, the peel strength of the test piece prepared by using the brazing material disclosed in Patent Document 1 was 15 kN/m or over. In other words, it was confirmed that, if the surface roughness Rmax of the brazing material layer is 25 μm or under, a desirable bonding strength can be secured.

For the scale-like irregularities formed on the surface of the brazing material layer shown in FIGS. 6(a) and 6(b), component analysis was conducted by using a wavelength dispersive X-ray spectrometer. As a result of this, it was confirmed that the main component of the concave part of the scale-like irregularities is constituted by a Cu—Ti phase, while that of the convex part is constituted by an Ag—In phase and a Cu—In phase, and that the larger the In addition amount, the higher the frequency of generation of the concave part is.

Example 2

In Example 2, about (1) the content of oxygen contained in the alloy powder, and (2) the content of Si contained in the alloy powder, the levels thereof were changed to confirm the influence which is exerted on the bonding strength, and the like.

In Example 2, a brazing material paste provided by kneading a powder mixture which is obtained by adding 10 pts. mass of an Ag powder with a d50 of 10 μm and a titanium hydride powder with a d50 of 15 μm in a proportion given in Table 6 to 100 pts. mass of an alloy powder containing oxygen and Si in a proportion given in Table 6 with a binder, a solvent, and the like, was prepared for each experiment No. In Table 6, the data for the experiment No. 3 in Example 1 is also given for use as reference. In Example 2, the content of Ag and that of In in the alloy powder were specified to be 70.0 mass % and 3.0 mass %, respectively, for all the experiment Nos. in a uniform manner. And, investigation of the particle size distribution of the powder mixture for all the experiment Nos. revealed that the particle size distribution for the respective experiments Nos. 36, 40, and 44 is practically the same as that for the experiment No. 2 in Table 3; that for the respective experiment Nos. 37, 41, and 45 to 52 practically the same as that for the experiment No. 3 in Table 3; that for the respective experiments Nos. 38 and 42 practically the same as that for the experiment No. 5 in Table 3; and that for the experiment No. 39 practically the same as that for the experiment No. 6 in Table 3.

TABLE 6

| | Alloy powder | | Titan. | Surface | | Void ratio | | Inter-circ. | Circ. pat. | Thermal cycle |
|---|---|---|---|---|---|---|---|---|---|---|
| Experiment No. | Oxygen cont. mass % | Si cont. mass % | hydride powder Add. amount pts. mass | roughness (Rmax) μm | Peel strength kN/m | Product part % | End portion % | insul. test failure rate % | dimensional reject rate % | test failure rate % |
| 36 | 0.15 | 0.05 | 0.6 | 21 | 17 | 5 | 44 | 0 | 0 | 3.0 |
| 37 | 0.15 | 0.05 | 1.0 | 15 | 19 | 4 | 32 | 0 | 0 | 2.0 |

TABLE 6-continued

| | Alloy powder | | Titan. | Surface | | Void ratio | | Inter-circ. | Circ. pat. | Thermal cycle |
|---|---|---|---|---|---|---|---|---|---|---|
| Experiment No. | Oxygen cont. mass % | Si cont. mass % | hydride powder Add. amount pts. mass | roughness (Rmax) μm | Peel strength kN/m | Product part % | End portion % | insul. test failure rate % | dimensional reject rate % | test failure rate % |
| 38 | 0.15 | 0.05 | 3.0 | 19 | 26 | 2 | 27 | 0 | 0 | 0.5 |
| 39 | 0.15 | 0.05 | 4.5 | 21 | 22 | 2 | 22 | 1.5 | 0 | 0 |
| 40 | 0.09 | 0.05 | 0.6 | 21 | 19 | 4 | 38 | 0 | 0 | 2.0 |
| 41 | 0.09 | 0.05 | 1.0 | 17 | 20 | 4 | 27 | 0 | 0 | 1.5 |
| 42 | 0.09 | 0.05 | 3.0 | 22 | 29 | 2 | 22 | 0 | 0 | 0 |
| 43 | 0.09 | 0.05 | 4.5 | 23 | 24 | 2 | 19 | 1.0 | 0 | 0 |
| 44 | 0.05 | 0.05 | 0.6 | 20 | 20 | 4 | 35 | 0 | 0 | 2.0 |
| 3 | 0.05 | 0.05 | 1.0 | 15 | 22 | 3 | 23 | 0 | 0 | 1.0 |
| 45 | 0.02 | 0.05 | 1.0 | 15 | 24 | 2 | 22 | 0 | 0 | 0 |
| 46 | 0.05 | 0.5 | 1.0 | 18 | 17 | 3 | 29 | 1.0 | 0 | 2.5 |
| 47 | 0.05 | 0.5 | 4.5 | 18 | 15 | 3 | 29 | 1.0 | 0 | 4.5 |
| 48 | 0.05 | 0.3 | 4.5 | 17 | 18 | 2 | 29 | 0.5 | 0 | 3.0 |
| 49 | 0.05 | 0.1 | 4.5 | 14 | 22 | 2 | 26 | 0 | 0 | 1.5 |
| 50 | 0.05 | 0.01 | 4.5 | 15 | 25 | 2 | 25 | 0 | 0 | 0 |
| 51 | 0.05 | 0.005 | 4.5 | 16 | 24 | 2 | 27 | 0 | 0 | 0 |
| 52 | 0.05 | 0.0001 | 4.5 | 15 | 20 | 3 | 33 | 0 | 0 | 0.5 |

The brazing material pastes for the experiments Nos. 36 to 52 were used to manufacture ceramic master circuit substrates in the same manner as that in the above-described Example 1. As the ceramic substrate, the same ceramic substrate made of silicon nitride as that in the above-described Example 1 was used. The various characteristics of the brazing material, ceramic circuit substrate, and test piece for each experiment No. that were obtained in Example 2 are as given in Table 6.

According to the experiments Nos. 3 and 36 to 45, it was confirmed that, even if the content of oxygen in the alloy powder is as high as 0.15 mass %, the advantage of the present invention can be provided, and further the desirable range of the content of oxygen is 0.1 mass % or under. In addition, according to the experiments Nos. 3 and 46 to 52, it was confirmed that, even if the content of Si in the alloy powder is as high as 0.5 mass %, or as low as 0.0001 mass %, the advantage of the present invention can be provided, and further the preferable range of the content of Si is 0.005 to 0.3 mass %.

Example 3

In Example 3, the levels of the particle size distribution, the bulk density, and the like, of the brazing material as a powder mixture were changed to confirm the effect exerted on the bonding strength, and the like. Herein, the powder mixture particle size distribution, the bulk density, and the like, were adjusted by changing the levels of the particle size distribution and the addition amount of the alloy powder, Ag powder and titanium hydride powder, respectively.

In Example 3, a brazing material paste provided by kneading a powder mixture which is obtained by adding an Ag powder and a titanium hydride powder each having a particle size distribution given in Table 7 to 100 pts. mass of an alloy powder with a particle size distribution given in Table 7, being composed of 70.0 mass % of Ag, 3.0 mass % of In, 0.05 mass % of oxygen, 0.01 mass % of Si, and the balance Cu with inevitable impurities, in an addition amount given in Table 7, respectively, with a binder, a solvent, and the like, was prepared for each experiment No. And, Table 8 gives the particle size distribution, and the like, of the brazing material as a powder mixture of the alloy powder, Ag powder, and active metal hydride powder for each experiment No., and Table 9 gives the equivalent circle average diameter of the particles of the alloy powder, Ag powder, and active metal hydride powder that was confirmed in the condition of a powder mixture, and the addition amount of the active metal hydride powder for each experiment No.

TABLE 7

| | Alloy powder | | | Ag powder | | | | Titanium hydride powder | | | |
|---|---|---|---|---|---|---|---|---|---|---|---|
| Exp. No. | d10 μm | d50 μm | d90 μm | Addition amount pts. mass | d10 μm | d50 μm | d90 μm | Addition amount pts. mass | d10 μm | d50 μm | d90 μm |
| 53 | 12.5 | 40.0 | 52.0 | 10.0 | 0.5 | 1.0 | 7.5 | 1.0 | 5.4 | 10.0 | 24.5 |
| 54 | 12.5 | 40.0 | 52.0 | 10.0 | 0.5 | 1.0 | 7.5 | 1.0 | 7.0 | 13.0 | 25.0 |
| 55 | 12.5 | 40.0 | 52.0 | 10.0 | 0.5 | 1.0 | 7.5 | 1.0 | 8.1 | 15.0 | 26.5 |
| 56 | 12.5 | 40.0 | 52.0 | 10.0 | 0.5 | 1.0 | 7.5 | 1.0 | 9.7 | 18.0 | 31.8 |
| 57 | 12.5 | 40.0 | 52.0 | 10.0 | 0.5 | 1.0 | 7.5 | 1.0 | 10.8 | 20.0 | 35.3 |
| 58 | 12.5 | 40.0 | 52.0 | 10.0 | 0.5 | 1.0 | 7.5 | 1.0 | 11.9 | 22.0 | 38.8 |
| 59 | 12.5 | 40.0 | 52.0 | 10.0 | 0.5 | 1.0 | 7.5 | 1.0 | 13.5 | 25.0 | 44.1 |
| 60 | 12.5 | 40.0 | 52.0 | 10.0 | 0.5 | 1.0 | 7.5 | 3.0 | 13.5 | 25.0 | 44.1 |
| 61 | 7.0 | 40.0 | 38.0 | 10.0 | 0.5 | 1.0 | 7.5 | 5.0 | 13.5 | 25.0 | 44.1 |
| 62 | 12.5 | 40.0 | 52.0 | 5.0 | 1.4 | 3.0 | 7.5 | 1.0 | 5.4 | 10.0 | 24.5 |
| 63 | 12.5 | 40.0 | 52.0 | 10.0 | 1.4 | 3.0 | 7.5 | 1.0 | 5.4 | 10.0 | 24.5 |
| 64 | 12.5 | 40.0 | 52.0 | 10.0 | 2.4 | 5.0 | 8.8 | 1.0 | 5.4 | 10.0 | 24.5 |
| 65 | 12.5 | 40.0 | 52.0 | 10.0 | 3.5 | 8.0 | 14.1 | 1.0 | 5.4 | 10.0 | 24.5 |
| 66 | 12.5 | 40.0 | 52.0 | 10.0 | 3.5 | 10.0 | 17.7 | 1.0 | 5.4 | 10.0 | 24.5 |

TABLE 7-continued

|  | Alloy powder | | | Ag powder Addition | | | | Titanium hydride powder Addition | | | |
| --- | --- | --- | --- | --- | --- | --- | --- | --- | --- | --- | --- |
| Exp. No. | d10 μm | d50 μm | d90 μm | amount pts. mass | d10 μm | d50 μm | d90 μm | amount pts. mass | d10 μm | d50 μm | d90 μm |
| 67 | 12.5 | 40.0 | 52.0 | 10.0 | 3.5 | 15.0 | 20.4 | 1.0 | 5.4 | 10.0 | 24.5 |
| 68 | 12.5 | 35.0 | 51.0 | 10.0 | 0.5 | 1.0 | 7.5 | 1.0 | 5.4 | 10.0 | 24.5 |
| 69 | 12.5 | 35.0 | 51.0 | 10.0 | 3.5 | 15.0 | 20.4 | 1.0 | 5.4 | 10.0 | 24.5 |
| 70 | 10.8 | 30.0 | 49.0 | 10.0 | 0.5 | 1.0 | 7.5 | 1.0 | 5.4 | 10.0 | 24.5 |
| 71 | 10.8 | 30.0 | 49.0 | 10.0 | 1.4 | 3.0 | 7.5 | 1.0 | 5.4 | 10.0 | 24.5 |
| 72 | 10.8 | 30.0 | 49.0 | 10.0 | 3.5 | 8.0 | 14.1 | 1.0 | 5.4 | 10.0 | 24.5 |
| 73 | 10.8 | 30.0 | 49.0 | 10.0 | 3.5 | 15.0 | 20.4 | 1.0 | 5.4 | 10.0 | 24.5 |
| 74 | 8.0 | 20.0 | 40.0 | 10.0 | 0.5 | 1.0 | 7.5 | 1.0 | 5.4 | 10.0 | 24.5 |
| 75 | 8.0 | 20.0 | 40.0 | 10.0 | 1.4 | 3.0 | 7.5 | 1.0 | 5.4 | 10.0 | 24.5 |
| 76 | 8.0 | 20.0 | 40.0 | 10.0 | 3.5 | 8.0 | 14.1 | 1.0 | 5.4 | 10.0 | 24.5 |
| 77 | 8.0 | 20.0 | 40.0 | 10.0 | 3.5 | 15.0 | 20.4 | 1.0 | 5.4 | 10.0 | 24.5 |
| 78 | 8.0 | 20.0 | 40.0 | 30.0 | 3.5 | 15.0 | 20.4 | 1.0 | 5.4 | 10.0 | 24.5 |
| 79 | 7.0 | 15.0 | 33.0 | 10.0 | 1.4 | 3.0 | 7.5 | 1.0 | 5.4 | 10.0 | 24.5 |
| 80 | 7.0 | 15.0 | 33.0 | 10.0 | 3.5 | 8.0 | 14.1 | 1.0 | 5.4 | 10.0 | 24.5 |
| 81 | 12.5 | 40.0 | 48.0 | 10.0 | 1.4 | 3.0 | 7.5 | 1.0 | 5.4 | 10.0 | 24.5 |
| 82 | 7.0 | 15.0 | 45.0 | 10.0 | 3.5 | 8.0 | 14.1 | 1.0 | 5.4 | 10.0 | 24.5 |
| 83 | 12.5 | 43.0 | 52.0 | 10.0 | 1.4 | 3.0 | 7.5 | 1.0 | 5.4 | 10.0 | 24.5 |
| 84 | 9.0 | 15.0 | 33.0 | 10.0 | 3.5 | 8.0 | 14.0 | 1.0 | 5.4 | 10.0 | 24.5 |
| 85 | 4.3 | 12.0 | 21.7 | 10.0 | 3.5 | 10.0 | 17.7 | 1.0 | 8.1 | 15.0 | 26.5 |
| 86 | 15.4 | 42.5 | 77.0 | 10.0 | 3.5 | 10.0 | 17.7 | 1.0 | 8.1 | 15.0 | 26.5 |
| 87 | 4.5 | 15.0 | 33.0 | 10.0 | 0.1 | 0.3 | 0.5 | 1.0 | 5.4 | 10.0 | 24.5 |
| 88 | 16.4 | 40.0 | 51.0 | 10.0 | 9.6 | 20.0 | 35.4 | 1.0 | 5.4 | 10.0 | 24.5 |
| 89 | 5.0 | 10.0 | 32.0 | 10.0 | 3.5 | 10.0 | 17.7 | 1.0 | 8.1 | 15.0 | 26.5 |
| 90 | 16.3 | 45.0 | 52.0 | 10.0 | 3.5 | 10.0 | 17.7 | 1.0 | 8.1 | 15.0 | 26.5 |
| 91 | 6.9 | 19.0 | 26.0 | 10.0 | 3.5 | 10.0 | 17.7 | 1.0 | 7.6 | 14.0 | 19.0 |
| 92 | 7.2 | 20.0 | 36.2 | 10.0 | 3.5 | 10.0 | 17.7 | 1.0 | 3.2 | 6.0 | 10.6 |
| 93 | 7.2 | 20.0 | 36.2 | 10.0 | 3.5 | 10.0 | 17.7 | 1.0 | 22.7 | 42.0 | 74.1 |

TABLE 8

| | Powder mixture, particle size distribution | | | | | | | | |
| --- | --- | --- | --- | --- | --- | --- | --- | --- | --- |
| Experiment No. | d10 μm | d50 μm | d60 μm | d80 μm | d90 μm | Peak particle diameter μm | (d50 − d10)/ (d90 − d10) — | (d50 − d10)/ 40% μm/% | Bulk density g/cm³ |
| 53 | 7.3 | 32.1 | 35.1 | 42.8 | 48.1 | 40.5 | 0.61 | 0.62 | 3.89 |
| 54 | 7.3 | 32.1 | 35.2 | 42.8 | 48.1 | 40.5 | 0.61 | 0.62 | 3.89 |
| 55 | 7.3 | 32.1 | 35.2 | 42.8 | 48.1 | 40.5 | 0.61 | 0.62 | 3.89 |
| 56 | 7.3 | 32.1 | 35.2 | 42.8 | 48.2 | 40.5 | 0.61 | 0.62 | 3.89 |
| 57 | 7.3 | 32.2 | 35.2 | 42.9 | 48.2 | 40.6 | 0.61 | 0.62 | 3.89 |
| 58 | 7.3 | 32.2 | 35.2 | 42.9 | 48.2 | 40.6 | 0.61 | 0.62 | 3.89 |
| 59 | 7.3 | 32.2 | 35.3 | 42.9 | 48.3 | 40.6 | 0.61 | 0.62 | 3.89 |
| 60 | 7.0 | 32.0 | 35.1 | 42.8 | 48.2 | 40.5 | 0.61 | 0.63 | 3.85 |
| 61 | 6.8 | 31.8 | 34.8 | 42.2 | 47.3 | 39.9 | 0.62 | 0.63 | 3.81 |
| 62 | 9.6 | 34.6 | 37.5 | 44.9 | 50.0 | 42.7 | 0.62 | 0.63 | 3.84 |
| 63 | 9.3 | 33.2 | 36.0 | 43.1 | 48.1 | 41.0 | 0.62 | 0.60 | 3.89 |
| 64 | 9.4 | 33.4 | 36.2 | 43.3 | 48.2 | 41.2 | 0.62 | 0.60 | 3.88 |
| 65 | 9.5 | 33.6 | 36.5 | 43.7 | 48.7 | 41.5 | 0.61 | 0.60 | 3.87 |
| 66 | 9.5 | 33.8 | 36.7 | 44.0 | 49.0 | 41.8 | 0.61 | 0.61 | 3.86 |
| 67 | 9.5 | 34.2 | 37.1 | 44.3 | 49.3 | 42.1 | 0.62 | 0.62 | 3.84 |
| 68 | 7.3 | 28.1 | 31.7 | 40.8 | 47.2 | 38.1 | 0.52 | 0.52 | 4.17 |
| 69 | 7.5 | 29.2 | 32.9 | 42.0 | 48.4 | 39.2 | 0.53 | 0.54 | 4.12 |
| 70 | 6.3 | 24.1 | 28.2 | 38.3 | 45.4 | 35.3 | 0.46 | 0.44 | 4.44 |
| 71 | 6.4 | 24.3 | 28.3 | 38.3 | 45.4 | 35.3 | 0.46 | 0.45 | 4.44 |
| 72 | 6.5 | 24.7 | 28.7 | 38.9 | 46.0 | 35.8 | 0.46 | 0.45 | 4.42 |
| 73 | 6.5 | 25.2 | 29.3 | 39.4 | 46.6 | 36.4 | 0.47 | 0.47 | 4.40 |
| 74 | 4.7 | 16.1 | 20.1 | 30.2 | 37.2 | 27.2 | 0.35 | 0.29 | 4.99 |
| 75 | 4.7 | 16.3 | 20.3 | 30.2 | 37.2 | 27.2 | 0.36 | 0.29 | 4.99 |
| 76 | 4.9 | 16.7 | 20.7 | 30.8 | 37.8 | 27.8 | 0.36 | 0.30 | 4.97 |
| 77 | 4.9 | 17.2 | 21.3 | 31.3 | 38.4 | 28.3 | 0.37 | 0.31 | 4.95 |
| 78 | 4.5 | 16.6 | 20.3 | 29.3 | 35.7 | 26.6 | 0.39 | 0.30 | 4.86 |
| 79 | 3.2 | 10.3 | 14.2 | 24.0 | 30.9 | 21.1 | 0.26 | 0.18 | 5.26 |
| 80 | 3.3 | 10.7 | 14.7 | 24.5 | 31.5 | 21.6 | 0.26 | 0.19 | 5.25 |
| 81 | 9.1 | 33.2 | 35.3 | 40.7 | 44.5 | 39.1 | 0.68 | 0.60 | 3.89 |
| 82 | 3.3 | 10.7 | 16.7 | 31.8 | 42.4 | 27.3 | 0.19 | 0.19 | 5.25 |
| 83 | 9.5 | 35.8 | 38.6 | 45.5 | 50.3 | 43.4 | 0.64 | 0.66 | 3.72 |
| 84 | 5.0 | 10.3 | 14.1 | 23.6 | 30.3 | 20.8 | 0.21 | 0.13 | 5.25 |
| 85 | 2.8 | 10.5 | 12.6 | 17.9 | 21.6 | 16.3 | 0.41 | 0.193 | 5.40 |

TABLE 8-continued

| | Powder mixture, particle size distribution | | | | | | | |
|---|---|---|---|---|---|---|---|---|
| Experiment No. | d10 μm | d50 μm | d60 μm | d80 μm | d90 μm | Peak particle diameter μm | (d50 − d10)/ (d90 − d10) — | (d50 − d10)/ 40% μm/% | Bulk density g/cm³ |
| 86 | 9.1 | 34.8 | 41.9 | 59.4 | 71.7 | 54.2 | 0.41 | 0.64 | 3.72 |
| 87 | 2.6 | 12.1 | 15.5 | 24.2 | 30.2 | 21.6 | 0.34 | 0.24 | 5.27 |
| 88 | 10.1 | 33.6 | 36.7 | 44.4 | 49.7 | 42.0 | 0.59 | 0.59 | 3.83 |
| 89 | 3.1 | 8.9 | 13.1 | 23.6 | 30.9 | 20.4 | 0.21 | 0.144 | 5.51 |
| 90 | 9.7 | 36.8 | 39.2 | 45.0 | 49.0 | 43.2 | 0.69 | 0.68 | 3.58 |
| 91 | 4.2 | 16.1 | 17.8 | 22.3 | 25.4 | 12.0 | 0.56 | 0.30 | 5.02 |
| 92 | 4.4 | 16.8 | 20.2 | 28.7 | 34.6 | 26.1 | 0.41 | 0.31 | 4.96 |
| 93 | 4.5 | 17.1 | 20.5 | 29.1 | 35.2 | 26.6 | 0.41 | 0.31 | 4.96 |

TABLE 9

| | Powder mixture, equivalent circle average diameter | | | |
|---|---|---|---|---|
| | Alloy powder | | Titanium hydride powder | |
| Experiment No. | Equivalent circle average diameter μm | Ag powder Equivalent circle average diameter μm | Equivalent circle average diameter μm | Addition amount mass % |
| 53 | 39.5 | 1.0 | 10.2 | 0.90 |
| 54 | 39.8 | 0.9 | 12.7 | 0.90 |
| 55 | 40.1 | 1.0 | 15.0 | 0.90 |
| 56 | 39.8 | 0.9 | 18.1 | 0.90 |
| 57 | 39.7 | 1.2 | 20.1 | 0.90 |
| 58 | 40.0 | 1.0 | 22.0 | 0.90 |
| 59 | 39.6 | 1.0 | 24.9 | 0.90 |
| 60 | 39.6 | 1.0 | 24.9 | 2.65 |
| 61 | 15.1 | 0.9 | 25.1 | 4.35 |
| 62 | 39.9 | 3.1 | 9.8 | 0.94 |
| 63 | 40.1 | 3.2 | 9.8 | 0.90 |
| 64 | 39.6 | 5.1 | 9.9 | 0.90 |
| 65 | 39.8 | 8.1 | 10.0 | 0.90 |
| 66 | 40.0 | 10.2 | 9.9 | 0.90 |
| 67 | 39.9 | 14.8 | 10.2 | 0.90 |
| 68 | 34.9 | 0.9 | 9.9 | 0.90 |
| 69 | 34.8 | 14.9 | 9.8 | 0.90 |
| 70 | 29.7 | 1.1 | 9.9 | 0.90 |
| 71 | 29.7 | 2.9 | 9.8 | 0.90 |
| 72 | 30.1 | 7.8 | 10.0 | 0.90 |
| 73 | 30.0 | 15.0 | 10.0 | 0.90 |
| 74 | 20.1 | 1.0 | 10.2 | 0.90 |
| 75 | 20.2 | 2.9 | 9.9 | 0.90 |
| 76 | 20.0 | 7.8 | 10.3 | 0.90 |
| 77 | 20.1 | 15.0 | 10.0 | 0.90 |
| 78 | 19.8 | 15.2 | 10.1 | 0.76 |
| 79 | 14.7 | 2.8 | 9.9 | 0.90 |
| 80 | 14.9 | 8.0 | 10.0 | 0.90 |
| 81 | 40.1 | 3.2 | 9.8 | 0.90 |
| 82 | 14.9 | 8.0 | 10.0 | 0.90 |
| 83 | 40.1 | 3.2 | 9.8 | 0.90 |
| 84 | 14.9 | 8.0 | 10.0 | 0.90 |
| 85 | 11.9 | 9.9 | 14.8 | 0.90 |
| 86 | 42.7 | 10.0 | 14.8 | 0.90 |
| 87 | 14.8 | 0.3 | 9.8 | 0.90 |
| 88 | 39.6 | 19.9 | 9.8 | 0.90 |
| 89 | 9.8 | 9.9 | 14.8 | 0.90 |
| 90 | 45.1 | 10.0 | 14.9 | 0.90 |
| 91 | 19.1 | 10.0 | 14.0 | 0.90 |
| 92 | 20.1 | 9.8 | 6.0 | 0.90 |
| 93 | 20.0 | 10.1 | 41.7 | 0.90 |

TABLE 10

| Exp. No. | Surface rough. (Rmax) μm | Peel strength kN/m | Void ratio Product part % | Void ratio End portion % | Inter-circuit insulation test failure rate % | Circuit pattern dimens. reject rate % | Thermal cycle test failure rate % |
|---|---|---|---|---|---|---|---|
| 53 | 25 | 16 | 4 | 28 | 4.0 | 2.5 | 5.0 |
| 54 | 23 | 18 | 4 | 28 | 3.5 | 2.0 | 4.0 |
| 55 | 22 | 18 | 4 | 30 | 2.5 | 2.0 | 3.0 |
| 56 | 22 | 20 | 3 | 31 | 1.0 | 0.5 | 2.0 |
| 57 | 20 | 20 | 3 | 35 | 1.0 | 0.5 | 2.0 |
| 58 | 22 | 18 | 4 | 38 | 1.5 | 0.5 | 3.5 |
| 59 | 23 | 17 | 4 | 48 | 2.0 | 0.5 | 3.5 |
| 60 | 23 | 21 | 3 | 48 | 2.0 | 0.5 | 2.0 |
| 61 | 22 | 16 | 4 | 27 | 2.0 | 1.0 | 4.5 |
| 62 | 25 | 15 | 5 | 48 | 2.5 | 0.0 | 5.0 |
| 63 | 24 | 17 | 4 | 26 | 2.5 | 0.0 | 4.5 |
| 64 | 22 | 18 | 4 | 27 | 1.0 | 0.0 | 4.5 |
| 65 | 22 | 18 | 3 | 28 | 0.5 | 0.0 | 3.5 |
| 66 | 22 | 17 | 3 | 28 | 1.0 | 0.0 | 3.5 |
| 67 | 22 | 16 | 3 | 33 | 2.0 | 0.0 | 4.5 |
| 68 | 20 | 19 | 3 | 27 | 2.5 | 1.5 | 3.0 |
| 69 | 16 | 20 | 3 | 32 | 1.0 | 0.0 | 3.0 |
| 70 | 17 | 20 | 2 | 27 | 1.5 | 1.0 | 2.0 |
| 71 | 15 | 23 | 1 | 25 | 1.5 | 0.5 | 0.0 |
| 72 | 13 | 25 | 1 | 28 | 0.5 | 0.0 | 0.0 |
| 73 | 16 | 21 | 2 | 29 | 0.0 | 0.0 | 1.0 |
| 74 | 17 | 21 | 3 | 28 | 0.5 | 0.0 | 0.5 |
| 75 | 13 | 24 | 2 | 21 | 0.0 | 0.0 | 0.0 |
| 76 | 18 | 25 | 2 | 22 | 0.0 | 0.0 | 0.0 |
| 77 | 20 | 22 | 3 | 28 | 0.0 | 0.0 | 0.5 |
| 78 | 18 | 16 | 5 | 40 | 3.5 | 1.5 | 4.0 |
| 79 | 18 | 20 | 3 | 33 | 3.5 | 3.5 | 1.5 |
| 80 | 17 | 18 | 3 | 31 | 2.5 | 2.5 | 3.5 |
| 81 | 24 | 17 | 3 | 28 | 4.0 | 4.0 | 4.0 |
| 82 | 17 | 16 | 4 | 32 | 2.5 | 0.5 | 4.5 |
| 83 | 24 | 15 | 3 | 34 | 2.5 | 1.0 | 5.0 |
| 84 | 20 | 16 | 4 | 35 | 2.5 | 2.0 | 4.5 |
| 85 | 18 | 18 | 3 | 32 | 8.0 | 7.0 | 2.0 |
| 86 | 23 | 12 | 8 | 44 | 2.5 | 0.0 | 13.0 |
| 87 | 16 | 22 | 7 | 34 | 21.0 | 11.5 | 8.0 |
| 88 | 22 | 14 | 7 | 39 | 2.5 | 0.0 | 10.0 |
| 89 | 18 | 19 | 3 | 30 | 10.0 | 9.0 | 1.5 |
| 90 | 22 | 13 | 7 | 40 | 0.5 | 0.0 | 10.5 |
| 91 | 14 | 22 | 4 | 25 | 9.5 | 7.5 | 3.0 |
| 92 | 19 | 14 | 7 | 32 | 0.0 | 0.0 | 10.5 |
| 93 | 22 | 13 | 6 | 37 | 0.0 | 0.0 | 16.5 |

The brazing material pastes for the experiment Nos. 53 to 93 were used to manufacture ceramic master circuit substrates in the same manner as that in the above-described Example 1. As the ceramic substrate, the same ceramic substrate made of silicon nitride as that in the above-described Example 1 was used.

From Example 3, the followings were confirmed. In other words, the surface roughness (Rmax) of the brazing material layer of the test piece formed by using the brazing material paste containing the brazing material in accordance with the present invention for the respective experiments Nos. 53 to 84 was 25 μm or under. And, the void ratio of the product part that was confirmed in the ceramic master circuit substrate formed in the respective experiments Nos. 53 to 84 was as low as 5%, and the void ratio of the edge portion was in the range of 5 to 50%. As a result of this, the peel strength (bonding strength) between the ceramic substrate and the metal plate in the test piece formed using the brazing material paste containing the brazing material for the respective experiments Nos. 53 to 84 was 15 kN/m or over, and the thermal cycle test failure ratio for the ceramic circuit substrate extracted from the ceramic master circuit substrate was 5% or under. In addition, the wet-spreading of the heated and melted brazing material in bonding was appropriate, thereby the inter-circuit insulation test failure ratio and the circuit pattern dimensional reject ratio for the ceramic circuit substrate were 5% or under.

On the other hand, in the case where the brazing materials in the experiments Nos. 85 to 93 with which a part of the conditions does not meet the requirements of the present invention were used, the thermal cycle test failure ratio was high, resulting from an insufficient peel strength (bonding strength), or the like, and the inter-circuit insulated properties test failure ratio or the circuit pattern dimensional reject ratio was high due to excessive wet-spreading as described below.

In the experiment No. 85, the value of d90 of the powder mixture was low, thereby the wet-spreading of the brazing material was excessive, resulting in the inter-circuit insulated properties test failure ratio and the circuit pattern dimensional reject ratio being high. In the experiment No. 86, the value of d90 of the powder mixture was high, thereby a residue on melting of coarse alloy powder particles was produced, resulting in the peel strength being lowered, and the thermal cycle test failure ratio being raised.

In the experiment No. 87, the value of d10 of the powder mixture was low, thereby the wet-spreading of the brazing material was excessive, resulting in the inter-circuit insulated properties test failure ratio and the circuit pattern dimensional reject rate being high. In the experiment No. 88, the value of d10 of the powder mixture was high, thereby the peel strength being lowered, and the thermal cycle test failure ratio being increased.

In the experiment No. 89, the value of d50 of the powder mixture was low, thereby the wet-spreading of the brazing material was excessive, resulting in the inter-circuit insulated properties test failure ratio and the circuit pattern dimensional reject rate being high. In the experiment No. 90, the value of d50 of the powder mixture was high, thereby the peel strength being lowered, and the thermal cycle test failure ratio being increased.

In the experiment No. 91, the peak in the frequency distribution was deviated from the range between d50 and d90 toward the smaller particle diameter side, thereby the wet-spreading of the brazing material was excessive, resulting in the inter-circuit insulated properties test failure ratio and the circuit pattern dimensional reject ratio being increased.

In the experiment No. 92, the equivalent circle average diameter of the titanium hydride powder was small, and in the experiment No. 93, the equivalent circle average diameter of the titanium hydride powder was large, thereby a sufficient peel strength could not be obtained in each of these experiments, resulting in the thermal cycle test failure ratio being high.

From the experiments Nos. 53 to 84, in which the brazing material in accordance with the present invention was used, the followings were confirmed. First, according to the experiments No. 53 to 61, in which the level of the particle size distribution of the titanium hydride powder was changed, it was confirmed that, if the equivalent circle diameter of each particle of the titanium hydride powder that was confirmed in the condition of a powder mixture was in the range of 10 to 25 μm, a desired peel strength was given; the thermal cycle test failure rate was low; further the wettability of the brazing material was appropriate; and the inter-circuit insulation test failure rate and the circuit pattern dimensional reject ratio were low. It was found that the powder mixture containing titanium hydride each particle of which has an equivalent circle diameter in this range can be formed by adding a titanium hydride powder having a particle size distribution preferably in the ranges of 5 to 15 μm for d10, 10 to 25 μm for d50, and 25 to 50 μm for d90 to the alloy powder.

The preferable range of the equivalent circle diameter of each particle of the titanium hydride powder is 12 to 22 μm, and further preferably, 15 to 20 μm, in view of the respective failure ratio. The respective ranges can be achieved by adding a titanium hydride powder preferably having a particle size distribution in the ranges of 7 to 12 μm for d10, 13 to 22 μm for d50, and 25 to 39 μm for d90, and in the ranges of 8 to 11 μm for d10, 15 to 20 μm for d50, and 26 to 35 μm for d90 to the alloy powder. Further, in the experiment No. 60, in which the addition amount of the titanium hydride powder in the powder mixture was 2.65 mass %, the peel strength was improved, while, in the experiment No. 61, in which the addition amount was 4.35 mass %, the peel strength was slightly lowered. As described in Example 1, the titanium hydride powder accounts for a low proportion in the brazing material, and therefore, it was confirmed that, even in the case where, as with the experiments Nos. 60 and 61, the amount of the titanium hydride powder added to the alloy powder was increased as compared to that in the experiment No. 58, the particle size distribution of the powder mixture obtained was practically not changed.

Next, according to the experiments Nos. 52 and 62 to 80 in which the particle size distributions of the alloy powder and the Ag powder, which have a great effect on the particle size distribution of the powder mixture, and the level of the addition amount were changed, it was verified that, with the brazing material in the condition of a powder mixture, in the case where (1) the equivalent circle average diameters of the particles of the alloy powder, Ag powder, and active metal hydride powder have the relationship of alloy powder≥active metal hydride powder>Ag powder; (2) in the cumulative distribution in volume base given upon a measurement of the particle size distribution in conformity with JIS Z 8825-1, there is provided a particle size distribution of 3 to 10 μm for the cumulative 10% particle diameter (d10), 10 to 35 μm for the cumulative 50% particle diameter (d50), and 30 to 50 μm for the cumulative 90% particle diameter (d90), and (3) in the frequency distribution, a peak exists between the cumulative 50% particle diameter (d50) and cumulative 90% particle diameter (d90), a desired peel strength can be obtained, and the thermal cycle test failure rate is low, thereby the advantage of the present invention is provided.

Herein, from the experiments Nos. 68 to 77, it was confirmed that the preferable ranges of the particle size distribution of the powder mixture are 4 to 8 μm for d10, 15 to 18 μm for d50, and 35 to 49 μm for d90. By controlling the powder mixture such that the particle size distribution provides such ranges, all of the inter-circuit insulated properties test failure ratio, the circuit pattern dimensional reject ratio, and thermal cycle test failure ratio are held to 3.0% or under. It was confirmed that the further preferable ranges of the particle size distribution of the powder mixture are 4.7 to 7 μm for d10, 16 to 26 μm for d50, and 36 to 47 μm for d90.

It was confirmed that the powder mixture having the above-mentioned particle size distribution can be preferably formed by adding an Ag powder with a d10 of 0.5 to 3 μm, a d50 of 1 to 15 μm, and a d90 of 8 to 20 μm to an alloy powder with a d10 of 6 to 12 μm, a d50 of 15 to 40 μm, and a d90 of 60 μm or under. The further preferable ranges of the particle size distribution of the alloy powder are 7 to 12 μm for d10, 20 to 35 μm for d50, and 55 μm or under for d90, and it is still further preferable that the value of d10 is in the range of 8 to 11 μm, the value of d50 is in the range of 20 to 30 μm, and the value of d90 is in the range of 40 to 50 μm. In addition, it was confirmed that the preferable ranges of the particle size distribution of the Ag powder are 1 to 3.5 μm for d10, 3 to 8 μm for d50, and 8 to 14 μm for d90.

In the experiment No. 81, in which the value of (d50−d10)/(d90−d10) for the particle size distribution of the powder mixture is 0.68, the inter-circuit insulated properties test failure ratio was lowered, as compared to that in the experiment No. 63, in which the particle size distribution is practically the same as that in the experiment No. 81 except for d90. In addition, in the experiment No. 82, in which the value of (d50−d10)/(d90−d10) is 0.19, the thermal cycle failure ratio was lowered, as compared to that in the experiment No. 80, in which the particle size distribution is practically the same as that in the experiment No. 82 except for d90. Therefore, it was confirmed that the value of (d50−d10)/(d90−d10) is preferably in the range of 0.2 to 0.65. The further preferable range is 0.3 to 0.5.

In the experiment No. 83, in which the value of (d50−d10)/40% for the particle size distribution of the powder mixture is 0.66 μm/%, the thermal cycle failure ratio was lowered, as compared to that in experiment No. 63, in which the particle size distribution is practically the same as that in the experiment No. 83 except for d50. In addition, in the experiment No. 84, in which the value of (d50−d10)/40% is 0.13 μm/%, the thermal cycle failure ratio was lowered, as compared to that in the experiment No. 80, in which the particle size distribution is practically the same as that in the experiment No. 80 except for d10. It can be supposed that, in all the cases, the cause is a low fillability of each particle in the powder mixture (brazing material). Therefore, it was confirmed that the value of (d50−d10)/40% is preferably in the range of 0.15 to 0.65. The further preferable range is 0.25 to 0.55.

DESCRIPTION OF SYMBOLS

The symbol 1 denotes a ceramic circuit board; 2 a ceramic substrate; 3a (3b to 3d, 7a) a brazing material layer, respectively; 4a (4b to 4c) a metal plate, respectively; 4e a circuit metal plate; 4d a heat dissipating metal plate; 5a an end portion metal plate; 8a (8b to 8c) a product pattern, respectively; 9a an end portion pattern; 10 a ceramic master circuit substrate; 20 a large-sized ceramic substrate; and 40 a large-sized metal plate.

The invention claimed is:

1. A brazing material for bonding between a ceramic substrate and a metal plate, comprising:
an alloy powder composed of at least 55 to 80 mass % of Ag, 1 to 5 mass % of In, and the balance Cu with inevitable impurities,
an Ag powder, and
an active metal hydride powder formed separately from said alloy powder and from said Ag powder,
wherein a composition ratio of Ag to the total amount of Ag and Cu contained in said powder mixture, Ag/(Ag+Cu), being 0.57 to 0.85,
the brazing material containing an active metal hydride powder with an equivalent circle average diameter of particles of 10 to 25 μm by 0.27 to 5.17 mass %,
the equivalent circle average diameters of particles for said alloy powder, Ag powder, and active metal hydride powder meeting a relationship of alloy powder>active metal hydride powder>Ag powder, and
in the cumulative distribution in volume base given upon a measurement of the particle size distribution in conformity with JIS Z 8825-1, said powder mixture having a particle size distribution of a cumulative 10% particle diameter (d10) of 3 to 10 μm, a cumulative 50% particle diameter (d50) of 10 to 35 μm, and a cumulative 90% particle diameter (d90) of 29.4 to 50 μm, and in the frequency distribution, a peak existing between the cumulative 50% particle diameter (d50) and the cumulative 90% particle diameter (d90), and
wherein the brazing material has a bulk density of 3.6 to 5.5 g/cm$^3$.

2. The brazing material according to claim 1, wherein said peak exists between a cumulative 60% particle diameter (d60) and a cumulative 80% particle diameter (d80).

3. The brazing material according to claim 2, wherein the value of (d50−d10)/(d90−d10) is 0.25 to 0.65.

4. The brazing material according to claim 2, wherein the value of (d50−d10)/40% is 0.15 to 0.65 μm/%.

5. The brazing material according to claim 1, wherein the bulk density is 3.84 to 4.12 g/cm$^3$.

6. The brazing material according to claim 5, wherein the value of (d50−d10)/(d90−d10) is 0.25 to 0.65.

7. The brazing material according to claim 1, wherein the value of (d50−d10)/(d90−d10) is 0.25 to 0.65.

8. The brazing material according to claim 1, wherein the value of (d50−d10)/40% is 0.15 to 0.65 μm/%.

9. The brazing material according to claim 1, comprising: an alloy powder with a cumulative 50% particle diameter (d50) of 15 to 40 μm composed of 55 to 80 mass % of Ag, 1 to 5 mass % of In, 0.1 mass % or under of oxygen content, and the balance Cu with inevitable impurities; 5 to 30 pts. mass of Ag powder particles with a cumulative 50% particle diameter (d50) of 1 to 15 μm for 100 pts. mass of said alloy powder; and 0.27 to 5.17 pts. mass of an active metal hydride powder having a particle size distribution of a cumulative 10% particle diameter (d10) of 5 to 15 μm, a cumulative 50% particle diameter (d50) of 10 to 25 μm, and a cumulative 90% particle diameter (d90) of 25 to 50 μm.

10. The brazing material according to claim 1, wherein said active metal hydride powder is a titanium hydride powder.

11. The brazing material according to claim 1, wherein the ratio of Ag to the total amount of Ag and Cu contained in said alloy powder, Ag/(Ag+Cu), is 0.6 to 0.7.

12. The brazing material according to claim 1, wherein said alloy powder contains 0.0001 to 0.5 mass % of Si.

13. The brazing material according to claim 1, wherein the cumulative 10% particle diameter (d10) of said alloy powder is 6 to 12 μm, and the cumulative 90% particle diameter (d90) of the same is 60 μm or under.

14. The brazing material according to claim 1, wherein the cumulative 10% particle diameter (d10) of said Ag powder is 0.5 to 3.0 μm, and the cumulative 90% particle diameter (d90) of the same is 8.0 to 20 μm or under.

15. A brazing material paste obtained by adding a binder by 1 to 10 mass %, and a solvent by 2 to 20 mass % to any one of the brazing materials according to claim 1, and kneading a resulting mixture.

16. A brazing material for bonding between a ceramic substrate and a metal plate, comprising:
- an alloy powder composed of at least 55 to 80 mass % of Ag, 1 to 5 mass % of In, and the balance Cu with inevitable impurities,
- an Ag powder, and
- an active metal hydride powder formed separately from said alloy powder and from said Ag powder,
- wherein a composition ratio of Ag to the total amount of Ag and Cu contained in said powder mixture, Ag/(Ag+Cu), being 0.57 to 0.85,
- the brazing material containing an active metal hydride powder with an equivalent circle average diameter of particles of 10 to 25 μm by 0.27 to 5.17 mass %,
- the equivalent circle average diameter of particles for the alloy powder is larger than the equivalent average diameter of particles for the active metal hydride powder by 2.8 mm or more, and
- in the cumulative distribution in volume base given upon a measurement of the particle size distribution in conformity with JIS Z 8825-1, said powder mixture having a particle size distribution of a cumulative 10% particle diameter (d10) of 3 to 10 μm, a cumulative 50% particle diameter (d50) of 10 to 35 μm, and a cumulative 90% particle diameter (d90) of 29.4 to 50 μm, and in the frequency distribution, a peak existing between the cumulative 50% particle diameter (d50) and the cumulative 90% particle diameter (d90), and
- wherein the brazing material has a bulk density of 3.6 to 5.5 g/cm$^3$.

* * * * *